United States Patent
Larson, III et al.

(10) Patent No.: US 7,423,503 B2
(45) Date of Patent: Sep. 9, 2008

(54) ACOUSTIC GALVANIC ISOLATOR INCORPORATING FILM ACOUSTICALLY-COUPLED TRANSFORMER

(75) Inventors: John D Larson, III, Palo Alto, CA (US); Ian Hardcastle, Sunnyvale, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 237 days.

(21) Appl. No.: 11/253,463

(22) Filed: Oct. 18, 2005

(65) Prior Publication Data

US 2007/0085631 A1 Apr. 19, 2007

(51) Int. Cl.
*H03H 9/54* (2006.01)
*H01L 41/083* (2006.01)
*H01L 41/107* (2006.01)
*H01P 1/36* (2006.01)
*H01L 41/18* (2006.01)

(52) U.S. Cl. .................... 333/189; 333/187
(58) Field of Classification Search ........... 333/187, 333/189
See application file for complete search history.

(56) References Cited

U.S. PATENT DOCUMENTS

| | | | |
|---|---|---|---|
| 3,174,122 A | 3/1965 | Fowler et al. | |
| 3,189,851 A | 6/1965 | Fowler | |
| 3,321,648 A | 5/1967 | Kolm | |
| 3,422,371 A | 1/1969 | Poirier et al. | |
| 3,568,108 A | 3/1971 | Poirier et al. | |
| 3,582,839 A | 6/1971 | Pim et al. | |
| 3,590,287 A | 6/1971 | Berlincourt et al. | |
| 3,610,969 A | 10/1971 | Clawson et al. | |
| 3,826,931 A | 7/1974 | Hammond | |
| 3,845,402 A * | 10/1974 | Nupp ........................... 330/10 |
| 4,084,217 A | 4/1978 | Brandis et al. | |
| 4,172,277 A | 10/1979 | Pinson | |
| 4,272,742 A | 6/1981 | Lewis | |
| 4,281,299 A * | 7/1981 | Newbold ..................... 333/187 |
| 4,320,365 A | 3/1982 | Black et al. | |
| 4,355,408 A * | 10/1982 | Scarrott ....................... 375/360 |
| 4,456,850 A | 6/1984 | Inoue et al. | |
| 4,529,904 A * | 7/1985 | Hattersley .................... 310/318 |
| 4,625,138 A | 11/1986 | Ballato | |
| 4,719,383 A | 1/1988 | Wang et al. | |
| 4,798,990 A | 1/1989 | Henoch | |
| 4,836,882 A | 6/1989 | Ballato | |
| 4,841,429 A | 6/1989 | Mcclanahan et al. | |
| 4,906,840 A | 3/1990 | Zdeblick et al. | |
| 5,048,036 A | 9/1991 | Scifres et al. | |

(Continued)

FOREIGN PATENT DOCUMENTS

DE 10160617 6/2003

(Continued)

OTHER PUBLICATIONS

U.S. Appl. No. 10/971,169, filed Oct. 22, 2004, Larson, III et al.

(Continued)

*Primary Examiner*—Barbara Summons

(57) ABSTRACT

Embodiments of the acoustic galvanic isolator comprise a carrier signal source, a modulator connected to receive an information signal and the carrier signal, a demodulator, and, connected between the modulator and the demodulator, an electrically-isolating acoustic coupler comprising an electrically-isolating film acoustically-coupled transformer (FACT).

12 Claims, 8 Drawing Sheets

U.S. PATENT DOCUMENTS

| | | |
|---|---|---|
| 5,048,038 A | 9/1991 | Brennan et al. |
| 5,118,982 A | 6/1992 | Inoue et al. |
| 5,129,132 A | 7/1992 | Zdeblick et al. |
| 5,162,691 A | 11/1992 | Mariani et al. |
| 5,241,209 A | 8/1993 | Sasaki |
| 5,241,456 A | 8/1993 | Marcinkiewicz et al. |
| 5,294,898 A | 3/1994 | Dworsky et al. |
| 5,382,930 A | 1/1995 | Stokes et al. |
| 5,384,808 A | 1/1995 | Van Brunt et al. |
| 5,448,014 A | 9/1995 | Kong et al. |
| 5,465,725 A | 11/1995 | Seyed-Boloforosh |
| 5,587,620 A | 12/1996 | Ruby et al. |
| 5,589,858 A | 12/1996 | Kadowaki et al. |
| 5,594,705 A | 1/1997 | Connor et al. |
| 5,671,242 A | 9/1997 | Takiguchi et al. |
| 5,692,279 A | 12/1997 | Mang et al. |
| 5,714,917 A | 2/1998 | Ella |
| 5,853,601 A | 12/1998 | Krishaswamy et al. |
| 5,864,261 A | 1/1999 | Weber |
| 5,872,493 A | 2/1999 | Ella |
| 5,873,153 A | 2/1999 | Ruby et al. |
| 5,873,154 A | 2/1999 | Ylilammi et al. |
| 5,910,756 A | 6/1999 | Ella |
| 5,936,150 A | 8/1999 | Korbin et al. |
| 5,953,479 A | 9/1999 | Zhou et al. |
| 5,982,297 A | 11/1999 | Welle |
| 6,040,962 A | 3/2000 | Kanazawa et al. |
| 6,060,818 A | 5/2000 | Ruby et al. |
| 6,087,198 A | 7/2000 | Panasik |
| 6,107,721 A | 8/2000 | Lakin |
| 6,111,480 A | 8/2000 | Iyama et al. |
| 6,124,756 A | 9/2000 | Yaklin et al. |
| 6,150,703 A | 11/2000 | Cushman et al. |
| 6,187,513 B1 | 2/2001 | Katakura |
| 6,215,375 B1 | 4/2001 | Larson, III et al. |
| 6,228,675 B1 | 5/2001 | Ruby et al. |
| 6,229,247 B1 | 5/2001 | Bishop |
| 6,252,229 B1 | 6/2001 | Hays et al. |
| 6,262,600 B1 | 7/2001 | Haigh et al. |
| 6,262,637 B1 | 7/2001 | Bradley et al. |
| 6,265,246 B1 | 7/2001 | Ruby et al. |
| 6,278,342 B1 | 8/2001 | Ella |
| 6,292,336 B1 | 9/2001 | Horng |
| 6,307,447 B1 | 10/2001 | Barber et al. |
| 6,307,761 B1 | 10/2001 | Nakagawa |
| 6,376,280 B1 | 4/2002 | Ruby et al. |
| 6,377,137 B1 | 4/2002 | Ruby |
| 6,384,697 B1 | 5/2002 | Ruby |
| 6,407,649 B1 | 6/2002 | Tikka et al. |
| 6,414,569 B1 | 7/2002 | Nakafuku |
| 6,420,820 B1 | 7/2002 | Larson, III |
| 6,424,237 B1 | 7/2002 | Ruby et al. |
| 6,429,511 B2 | 8/2002 | Ruby et al. |
| 6,434,030 B1 | 8/2002 | Rehm et al. |
| 6,437,482 B1 | 8/2002 | Shibata |
| 6,441,539 B1 | 8/2002 | Kitamura et al. |
| 6,462,631 B2 | 10/2002 | Bradley et al. |
| 6,466,105 B1 | 10/2002 | Lobl et al. |
| 6,466,418 B1 | 10/2002 | Horng et al. |
| 6,469,597 B2 | 10/2002 | Ruby et al. |
| 6,472,954 B1 | 10/2002 | Ruby et al. |
| 6,476,536 B1 | 11/2002 | Pensala |
| 6,479,320 B1 | 11/2002 | Gooch |
| 6,483,229 B2 | 11/2002 | Ylilammi et al. |
| 6,489,688 B1 | 12/2002 | Baumann et al. |
| 6,492,883 B2 | 12/2002 | Liang et al. |
| 6,507,983 B1 | 1/2003 | Ruby et al. |
| 6,518,860 B2 | 2/2003 | Ella et al. |
| 6,525,996 B1 | 2/2003 | Miyazawa |
| 6,530,515 B1 | 3/2003 | Glenn et al. |
| 6,534,900 B2 | 3/2003 | Aigner et al. |
| 6,542,055 B1 | 4/2003 | Frank et al. |
| 6,548,942 B1 | 4/2003 | Panaski |
| 6,550,664 B2 | 4/2003 | Bradley et al. |
| 6,564,448 B1 | 5/2003 | Oura et al. |
| 6,566,979 B2 | 5/2003 | Larson et al. |
| 6,583,374 B2 | 6/2003 | Knieser et al. |
| 6,583,688 B2 | 6/2003 | Klee et al. |
| 6,593,870 B2 | 7/2003 | Dummermuth et al. |
| 6,600,390 B2 | 7/2003 | Frank |
| 6,601,276 B2 | 8/2003 | Barber |
| 6,617,249 B2 | 9/2003 | Ruby et al. |
| 6,617,750 B2 | 9/2003 | Dummermuth et al. |
| 6,630,753 B2 | 10/2003 | Malik et al. |
| 6,635,509 B1 | 10/2003 | Ouellet |
| 6,639,872 B1 | 10/2003 | Rein |
| 6,651,488 B2 | 11/2003 | Larson et al. |
| 6,657,363 B1 | 12/2003 | Aigner |
| 6,668,618 B2 | 12/2003 | Larson et al. |
| 6,670,866 B2 | 12/2003 | Ella et al. |
| 6,693,500 B2 | 2/2004 | Yang et al. |
| 6,710,508 B2 | 3/2004 | Ruby et al. |
| 6,710,681 B2 | 3/2004 | Figueredo et al. |
| 6,714,102 B2 | 3/2004 | Ruby et al. |
| 6,720,844 B1 * | 4/2004 | Lakin ........................ 333/133 |
| 6,720,846 B2 | 4/2004 | Iwashita et al. |
| 6,724,266 B2 | 4/2004 | Plazza et al. |
| 6,777,263 B1 | 8/2004 | Gan et al. |
| 6,787,048 B2 | 9/2004 | Bradley et al. |
| 6,788,170 B1 | 9/2004 | Kaitila et al. |
| 6,803,835 B2 | 10/2004 | Frank |
| 6,812,619 B1 | 11/2004 | Kaitila et al. |
| 6,828,713 B2 | 12/2004 | Bradley et al. |
| 6,842,088 B2 | 1/2005 | Yamada et al. |
| 6,873,065 B2 | 3/2005 | Haigh et al. |
| 6,873,529 B2 | 3/2005 | Ikuta |
| 6,874,211 B2 | 4/2005 | Bradley et al. |
| 6,874,212 B2 | 4/2005 | Larson, III |
| 6,888,424 B2 | 5/2005 | Takeuchi et al. |
| 6,900,705 B2 | 5/2005 | Nakamura et al. |
| 6,903,452 B2 | 6/2005 | Ma et al. |
| 6,906,451 B2 | 6/2005 | Yamada |
| 6,911,708 B2 | 6/2005 | Park |
| 6,917,261 B2 | 7/2005 | Unterberger |
| 6,924,583 B2 | 8/2005 | Lin et al. |
| 6,924,717 B2 | 8/2005 | Ginsburg et al. |
| 6,927,651 B2 | 8/2005 | Larson, III et al. |
| 6,936,928 B2 | 8/2005 | Hedler et al. |
| 6,936,954 B2 | 8/2005 | Peczalski |
| 6,946,928 B2 | 9/2005 | Larson et al. |
| 6,954,121 B2 | 10/2005 | Bradley et al. |
| 6,963,257 B2 | 11/2005 | Ella et al. |
| 6,975,183 B2 | 12/2005 | Aigner et al. |
| 6,977,563 B2 | 12/2005 | Komuro et al. |
| 6,985,052 B2 | 1/2006 | Tikka |
| 6,987,433 B2 | 1/2006 | Larson et al. |
| 6,989,723 B2 | 1/2006 | Komuro et al. |
| 6,998,940 B2 | 2/2006 | Metzger |
| 7,019,604 B2 | 3/2006 | Gotoh et al. |
| 7,019,605 B2 | 3/2006 | Larson et al. |
| 7,057,476 B2 | 6/2006 | Hwu |
| 7,084,553 B2 | 8/2006 | Ludwiczak |
| 7,091,649 B2 | 8/2006 | Larson |
| 7,098,758 B2 | 8/2006 | Wang et al. |
| 7,170,215 B2 | 1/2007 | Namba et al. |
| 7,173,504 B2 | 2/2007 | Larson |
| 7,187,254 B2 | 3/2007 | Su et al. |
| 7,230,509 B2 | 6/2007 | Stoemmer |
| 2002/0000646 A1 | 1/2002 | Gooch et al. |
| 2002/0030424 A1 | 3/2002 | Iwata |
| 2002/0121944 A1 | 9/2002 | Larson, III et al. |
| 2002/0121945 A1 | 9/2002 | Ruby et al. |
| 2002/0152803 A1 | 10/2002 | Larson, III et al. |
| 2002/0190814 A1 | 12/2002 | Yamada et al. |

| | | | |
|---|---|---|---|
| 2003/0001251 A1 | 1/2003 | Cheever et al. | |
| 2003/0006502 A1 | 1/2003 | Karpman | |
| 2003/0087469 A1 | 5/2003 | Ma | |
| 2003/0102776 A1 | 6/2003 | Takeda et al. | |
| 2003/0111439 A1 | 6/2003 | Fetter et al. | |
| 2003/0128081 A1 | 7/2003 | Ella et al. | |
| 2003/0132493 A1 | 7/2003 | Kang et al. | |
| 2003/0141946 A1 | 7/2003 | Ruby et al. | |
| 2003/0179053 A1 | 9/2003 | Aigner et al. | |
| 2004/0092234 A1 | 5/2004 | Pohjonen | |
| 2004/0124952 A1 | 7/2004 | Tikka | |
| 2004/0150293 A1 | 8/2004 | Uterberger | |
| 2004/0150296 A1 | 8/2004 | Park et al. | |
| 2004/0195937 A1 | 10/2004 | Matsubara et al. | |
| 2004/0257172 A1 | 12/2004 | Schmidhammer et al. | |
| 2004/0263287 A1 | 12/2004 | Ginsburg et al. | |
| 2005/0012570 A1 | 1/2005 | Korden et al. | |
| 2005/0023931 A1 | 2/2005 | Bouche et al. | |
| 2005/0030126 A1 | 2/2005 | Inoue et al. | |
| 2005/0036604 A1 | 2/2005 | Scott et al. | |
| 2005/0057117 A1 | 3/2005 | Nakatsuka et al. | |
| 2005/0057324 A1 | 3/2005 | Onishi et al. | |
| 2005/0068124 A1 | 3/2005 | Stoemmer | |
| 2005/0093396 A1 | 5/2005 | Larson et al. | |
| 2005/0093653 A1 | 5/2005 | Larson, III | |
| 2005/0093654 A1 | 5/2005 | Larson, III et al. | |
| 2005/0093655 A1 | 5/2005 | Larson, III et al. | |
| 2005/0093657 A1 | 5/2005 | Larson et al. | |
| 2005/0093658 A1 | 5/2005 | Larson, III et al. | |
| 2005/0093659 A1 | 5/2005 | Larson, III et al. | |
| 2005/0104690 A1 | 5/2005 | Larson, III et al. | |
| 2005/0110598 A1 | 5/2005 | Larson, III | |
| 2005/0128030 A1 | 6/2005 | Larson et al. | |
| 2005/0140466 A1 | 6/2005 | Larson, III et al. | |
| 2005/0167795 A1 | 8/2005 | Higashi | |
| 2005/0193507 A1 | 9/2005 | Ludwiczak | |
| 2005/0206271 A1 | 9/2005 | Higuchi et al. | |
| 2005/0218488 A1 | 10/2005 | Mie | |
| 2006/0087199 A1* | 4/2006 | Larson et al. ............... 310/318 | |
| 2006/0103492 A1 | 5/2006 | Feng et al. | |
| 2006/0132262 A1 | 6/2006 | Fazzlo et al. | |
| 2006/0164183 A1 | 7/2006 | Tikka | |
| 2006/0185139 A1 | 8/2006 | Larson, III et al. | |
| 2007/0084964 A1 | 4/2007 | John et al. | |
| 2007/0085447 A1* | 4/2007 | Larson, III .................. 310/318 | |
| 2007/0085631 A1* | 4/2007 | Larson et al. ............... 333/187 | |
| 2007/0085632 A1* | 4/2007 | Larson et al. ............... 333/187 | |
| 2007/0086080 A1* | 4/2007 | Larson et al. .......... 359/341.33 | |
| 2007/0086274 A1* | 4/2007 | Nishimura et al. .......... 367/140 | |
| 2007/0090892 A1* | 4/2007 | Larson, III ................. 333/24.2 | |
| 2007/0170815 A1* | 7/2007 | Unkrich ...................... 310/318 | |
| 2007/0171002 A1* | 7/2007 | Unkrich ...................... 333/189 | |

FOREIGN PATENT DOCUMENTS

| | | |
|---|---|---|
| EP | 0865157 | 9/1998 |
| EP | 0880227 | 11/1998 |
| EP | 0973256 | 1/2000 |
| EP | 1047189 | 10/2000 |
| EP | 1100196 | 11/2000 |
| EP | 1096259 | 5/2001 |
| EP | 1258990 | 11/2002 |
| EP | 1180494 | 3/2003 |
| EP | 1542362 | 6/2003 |
| EP | 1258989 | 1/2004 |
| EP | 1528674 | 6/2004 |
| EP | 1528675 | 6/2004 |
| EP | 1528677 | 7/2004 |
| EP | 1249932 | 3/2005 |
| EP | 1517443 | 3/2005 |
| EP | 1517444 | 3/2005 |
| EP | 1557945 | 7/2005 |
| EP | 1575165 | 9/2005 |
| GB | 1 207 974 | 11/1967 |
| GB | 2411239 | 8/2005 |
| GB | 2418791 | 4/2006 |
| JP | 2002217676 | 8/2002 |
| WO | WO 98/16957 | 4/1998 |
| WO | WO-01/06647 | 1/2001 |
| WO | WO-01/99276 | 12/2001 |
| WO | WO-02/103900 | 12/2002 |
| WO | WO-03/030358 | 4/2003 |
| WO | WO-03/043188 | 5/2003 |
| WO | WO 03/050950 | 6/2003 |
| WO | WO-2003/058809 | 7/2003 |
| WO | WO-2004/034579 | 4/2004 |
| WO | WO-2004/051744 | 6/2004 |
| WO | WO-2005/043752 | 5/2005 |
| WO | WO-2005/043753 | 5/2005 |
| WO | WO-2005/043756 | 5/2005 |

OTHER PUBLICATIONS

Martin et al., "Development of Low-Dielectric Constant Polymer for Fabrication of Integrated Circuit Interconnect", 12 Advanced Materials, 1769 (2000).
U.S. Appl. No. 11/253,464, filed Oct. 18, 2005, Larson, III et al.
U.S. Appl. No. 11/253,851, filed Oct. 18, 2005, Larson, III.
U.S. Appl. No. 11/253,508, filed Oct. 18, 2005, Larson, III.
U.S. Appl. No. 11/253,444, filed Oct. 18, 2005, Larson, III et al.
U.S. Appl. No. 11/252,845, filed Oct. 18, 2005, Nishimura et al.
Examination report from corresponding application No. GB0605779.8 dated Aug. 23, 2006.
Holzlohner, Ronald et al., "Accurate Calculation of Eye Diagrams and Bit Error Rates in Optical Transmission Systems Using Linearization", *Journal of Lightwave Technology*, vol. 20, No. 3,, (Mar. 2002),pp. 389-400.
Reinhardt, Alexandre et al., "Design of Coupled Resonator Filters Using Admittance and Scattering Matrices", *2003 IEEE Ultrasonics Symposium*, (May 3, 2003),1428-1431.
Navas, J. et al., "Miniaturised Battery Charger using Piezoelectric Transformers", *IEEE*, (2001),492-496.
Jiang, Yimin et al., "A Novel Single-Phase Power Factor Correction Scheme", *IEEE* (1993),287-292.
Lakin, K.M. "Coupled Resonator Filters", *2002 IEEE Ultrasonics Symposium*, (Mar. 2, 2002),901-908.
Lakin, K.M. "High Performance Stacked Crystal Filters for GPS and Wide Bandwidth Applications", *2001 IEEE Ultrasonics Symposium*, (Jan. 1, 2001),833-838.
Krishnaswamy, S.V. et al., "Film Bulk Acoustic Wave Resonator Technology", (May 29, 1990),529-536.
Lobl, H.P. et al., "Piezoelectric Materials For BAW Resonators And Filters", *2001 IEEE Ultrasonics Symposium*, (Jan. 1, 2001),807-811.
Lakin, K.M. "Bulk Acoustic Wave Coupled Resonator Filers", *2002 IEEE International Frequency Control Symposium and PDA Exhibition*, (Jan. 2, 2002),8-14.
Jung, Jun-Phil et al., "Experimental And Theoretical Investigation On The Relationship Between AlN Properties And AlN-Based FBAR Characteristics", *2003 IEEE International Frequency Control Symposium and PDA Exhibition Jointly with the 17th European Frequency and Time Forum*, (Sep. 3, 2003),779-784.
Yang, C.M. et al., "Highly C Axis Oriented AlN Film Using MOCVD For 5GHx Band FBAR Filter", *2003 IEEE Ultrasonics Symposium*, (Oct. 5, 2003),pp. 170-173.
Hadimioglu, B. et al., "Polymer Films As Acoustic Matching Layers"., *1990 IEEE Ultrasonics Symposium Proceedings, vol. 3 pp.*, Previously submitted as "Polymer Files As Acoustic Matching Layers, 1990 IEEE Ultrasonics Symposium Proceeding. vol. 4 pp. 1227-1340, Dec. 1990". Considered by Examiner on Mar. 20, 2007,(Dec. 1990),1337-1340.
"Examination Report from UK for application", *GB 0605971.1*, (Aug. 24, 2006).
"Examination Report corresponding to application No.", *GB0605770.7*, (Aug. 25, 2006).
"Examination Report corresponding to application No.", *GB0605775.6*, (Aug. 30, 2006).

"Search report from corresponding application No.", *GB0620152.9*, (Nov. 15, 2006).

"Search report from corresponding application No.", *GB0620655.1*, (Nov. 17, 2006).

"Search report from corresponding application No.", *GB0620653.6*, (Nov. 17, 2006).

"Search Report from corresponding application No.", *GB0620657.7*, (Nov. 23, 2006).

Coombs, Clyde F., et al., "Electronic Instrument Handbook", *Second Edition, McGraw-Hill, Inc.*, (1995),pp. 5.1 to 5.29.

"A partial copy of GB Search Report for", *Application No. GB0522393.8*, (Jan. 9, 2006),4 pages.

"A partial copy of GB Search Report for Application No.", *GB0525884.3*, (Feb. 2, 2006),4 pgs.

Auld, B. A., "Acoustic Resonators", *Acoustic Fields and Waves in Solids, Second Edition, vol. II*, (1990),250-259.

"British Search Report Application No.", *0605222.9*, (Jul. 11, 2006).

Tiersten, H. F., et al., "An Analysis of Thiskness-Extensional Trapped Energy Resonant Device Structures wiht Rectangular Electrodes in the Piezoelectric Thin Film on Silicon Configuration", *J. Appl. Phys.* 54 (10), (Oct. 1983),5893-5910.

"Search Report from corresponding application", *No. GB0605225.2*, (Jun. 26, 2006).

"Search Report for Great Britain Patent Application", *No. 0617742. 2*, (Mar. 29, 2007).

"Search Report for Great Britain Patent Application"*No. 0617742.2*, (Dec. 13, 2006).

"Search Report in the Great Britain Patent Application", *No. 0619698.4*, (Nov. 30, 2006).

Rubby, R. et al., "The Effect of Perimeter Geometry on FBAR Resonator Electrical Performance", *Microwave Symposium Digest, 2005 IEEE MTT-S International*, (Jun. 12, 2005),217-221.

Schuessler, Hans H., "Ceramic Filters and Resonators", *Reprinted from IEEE Trans. Sonics Ultrason.*, vol. SU-21, (Oct. 1974),257-268.

Fattinger, G. G., et al., "Coupled Bulk Acoustic Wave Resonator Filters: Key technology for single-to-balanced RF filters", *0-7803-8331-1/4W20.00; IEEE MTT-S Digest*, (2004),927-929.

Choi, Sungjin et al., "Design of Half-Bridge Piezo-Transformer Converters in the AC Adapter Applications", *IEEE 2005*, 244-248.

Li, Yunxiu et al., "AC-DC Converter with Worldwide Range Input Voltage by Series and Parallel Piezoelectric Transformer Connection", (2004).

Ivensky, Gregory et al., "A Comparison of Piezoelectric Transformer AC/DC Converters with Current Doubler and voltage Doubler Rectifiers", *IEEE Transactions on Power Electronics*, vol. 19, No. 6., (Nov. 2004).

* cited by examiner

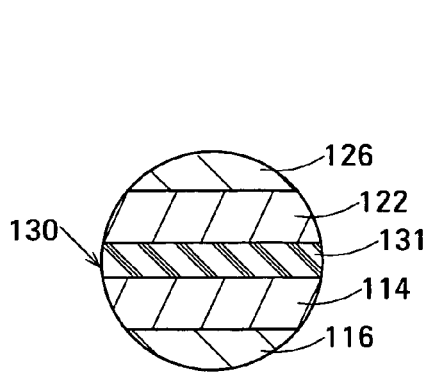
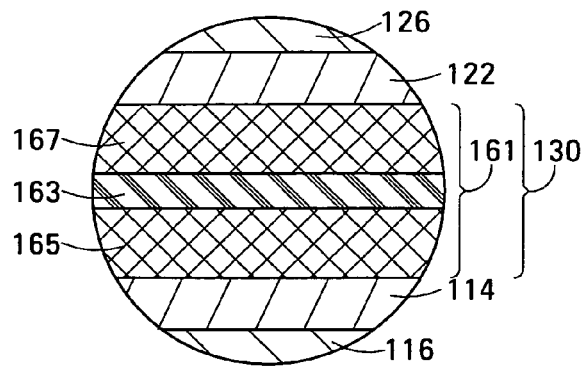
FIG. 5A  FIG. 5B
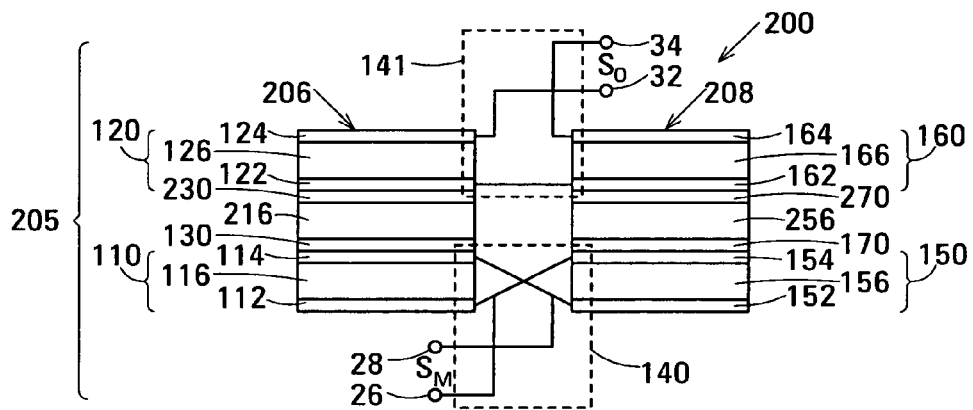
FIG. 6
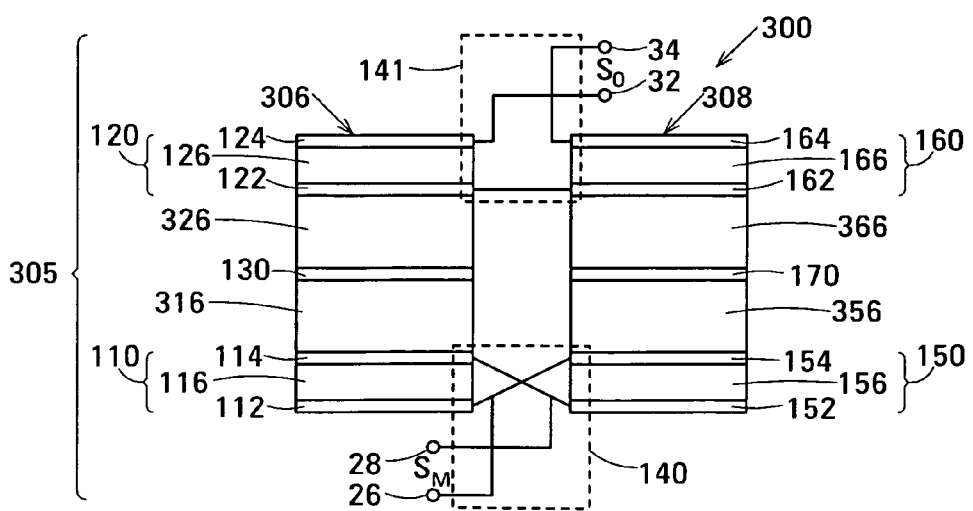
FIG. 8

US 7,423,503 B2

ACOUSTIC GALVANIC ISOLATOR INCORPORATING FILM ACOUSTICALLY-COUPLED TRANSFORMER

RELATED APPLICATIONS

This disclosure is related to the following simultaneously-filed disclosures: Acoustic Galvanic Isolator Incorporating Single Decoupled Stacked Bulk Acoustic Resonator of John D. Larson III Ser. No. 11/253,851; Acoustic Galvanic Isolator Incorporating Single Insulated Decoupled Stacked Bulk Acoustic Resonator With Acoustically-Resonant Electrical Insulator of John D. Larson III Ser. No. 11/253,508; Acoustic Galvanic Isolator Incorporating Series-Connected Decoupled Stacked Bulk Acoustic Resonators of John D. Larson III et al. Ser. No. 11/253,444; and Acoustic Galvanic Isolator of John D. Larson III et al. Ser. No. 11/253,464, all of which are assigned to the assignee of this disclosure and are incorporated by reference.

BACKGROUND

A galvanic isolator allows an information signal to pass from its input to its output but has no electrical conduction path between its input and its output. The lack of an electrical conduction path allows the galvanic isolator to prevent unwanted voltages from passing between its input and its output. Strictly speaking, a galvanic isolator blocks only DC voltage, but a typical galvanic isolator additionally blocks a.c. voltage, such as voltages at power line and audio frequencies. An example of a galvanic isolator is a data coupler that passes a high data rate digital information signal but blocks DC voltages and additionally blocks low-frequency a.c. voltages.

One example of a data coupler is an opto-isolator such as the opto-isolators sold by Agilent Technologies, Inc. In an opto-isolator, an electrical information signal is converted to a light signal by a light-emitting diode (LED). The light signal passes through an electrically non-conducting light-transmitting medium, typically an air gap or an optical waveguide, and is received by a photodetector. The photodetector converts the light signal back to an electrical signal. Galvanic isolation is provided because the light signal can pass through the electrically non-conducting light-transmitting medium without the need of metallic conductors.

Other data couplers include a transformer composed of a first coil magnetically coupled to a second coil. Passing the electrical information signal through the first coil converts the electrical information signal to magnetic flux. The magnetic flux passes through air or an electrically non-conducting permeable magnetic material to the second coil. The second coil converts the magnetic flux back to an electrical signal. The transformer allows the high data rate information signal to pass but blocks transmission of DC voltages and low-frequency a.c. voltages. The resistance of the conveyor of the magnetic flux is sufficient to prevent DC voltages and low-frequency a.c. voltages from passing from input to output. Blocking capacitors are sometimes used to provide similar isolation.

Inexpensive opto-isolators are typically limited to data rates of about 10 Mb/s by device capacitance, and from power limitations of the optical devices. The transformer approach requires that the coils have a large inductance yet be capable of transmitting the high data rate information signal. Such conflicting requirements are often difficult to reconcile. Using capacitors does not provide an absolute break in the conduction path because the information signal is transmitted electrically throughout. More successful solutions convert the electrical information signal to another form of signal, e.g., light or a magnetic flux, and then convert the other form of signal back to an electrical signal. This allows the electrical path between input and output to be eliminated.

Many data transmission systems operate at speeds of 100 Mb/s. What is needed is a compact, inexpensive galvanic isolator capable of operating at speeds of 100 Mb/s and above. What is also needed is a compact, inexpensive galvanic isolator that is simple to fabricate and has good common-mode rejection.

SUMMARY OF THE INVENTION

In a first aspect, the invention provides an acoustic galvanic isolator. Embodiments of the acoustic galvanic isolator comprise a carrier signal source, a modulator connected to receive an information signal and the carrier signal, a demodulator, and, connected between the modulator and the demodulator, an electrically-isolating acoustic coupler comprising an electrically-isolating film acoustically-coupled transformer (FACT).

In a second aspect, the invention provides a method for galvanically isolating an information signal. Embodiments of the method comprise providing an electrically-isolating acoustic coupler comprising an electrically-isolating film acoustically-coupled transformer (FACT); providing a carrier signal; modulating the carrier signal with the information signal to form a modulated electrical signal; acoustically coupling the modulated electrical signal through the electrically-isolating acoustic coupler; and recovering the information signal from the modulated electrical signal coupled through the electrically-isolating acoustic coupler.

An electrically-isolating acoustic coupler comprising an electrically-isolating FACT is physically small and is inexpensive to fabricate yet is capable of acoustically coupling information signals having data rates in excess of 100 Mbit/s and of withstanding a substantial DC or a.c. voltage between its inputs and its outputs. Additionally, an electrically-isolating acoustic coupler comprising an electrically-isolating FACT provides superior common-mode rejection between its inputs and its outputs.

BRIEF DESCRIPTION OF THE DRAWINGS

FIG. 5A is an enlarged view of the portion marked 5A in FIG. 4B showing a first embodiment of the acoustic decoupler.

FIG. 5B is an enlarged view of the portion marked 5A in FIG. 4B showing a second embodiment of the acoustic decoupler.

FIG. 6 is a schematic diagram showing an example of an acoustic coupler in accordance with a second embodiment of the invention that may be used as the electrically-isolating acoustic coupler of the acoustic galvanic isolator shown in FIG. 1.

FIG. 8 is a schematic diagram showing an example of an acoustic coupler in accordance with a third embodiment of the invention that may be used as the electrically-isolating acoustic coupler of the acoustic galvanic isolator shown in FIG. 1.

DETAILED DESCRIPTION

Figure 1:
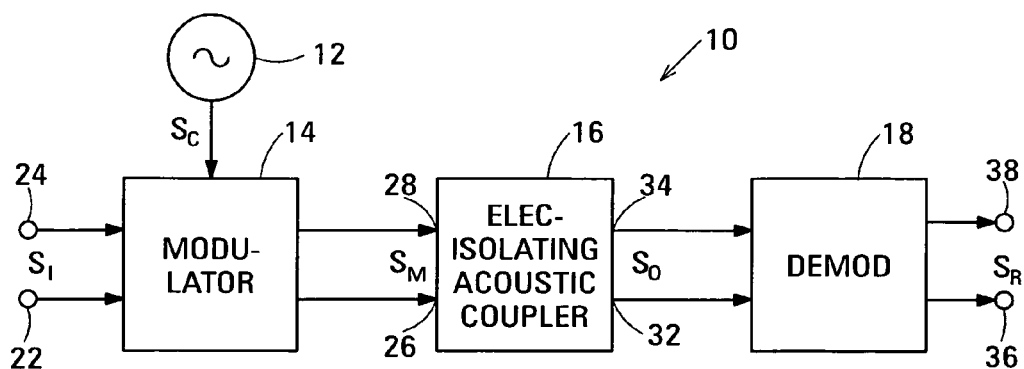
FIG. 1 is a block diagram showing an acoustic galvanic isolator in accordance with an embodiment of the invention.

FIG. 1 is a block diagram showing an acoustic galvanic isolator 10 in accordance with a first embodiment of the invention. Acoustic galvanic isolator 10 transmits an electrical information signal $S_I$ between its input terminals and its output terminals yet provides electrical isolation between its input terminals and its output terminals. Acoustic galvanic isolator 10 not only provides electrical isolation at DC but also provides a.c. electrical isolation. Additionally acoustic galvanic isolator 10 has superior common-mode rejection between its input terminals and its output terminals. Electrical information signal $S_I$ is typically a high data rate digital data signal, but may alternatively be an analog signal. In one application, electrical information signal $S_I$ is a 100 Mbit/sec Ethernet signal.

In the example shown, acoustic galvanic isolator 10 is composed of a local oscillator 12, a modulator 14, an electrically-isolating acoustic coupler 16 and a demodulator 18. In the example shown, local oscillator 12 is the source of an electrical carrier signal $S_C$. Modulator 14 has inputs connected to receive electrical information signal $S_I$ from input terminals 22, 24 of acoustic galvanic isolator 10 and to receive carrier signal $S_C$ from local oscillator 12. Modulator 14 has outputs connected to inputs 26, 28 of electrically-isolating acoustic coupler 16.

Electrically-isolating acoustic coupler 16 provides a differential output at outputs 34, 36. Outputs 32, 34 of electrically-isolating acoustic coupler 16 are connected to the inputs of demodulator 18. The outputs of demodulator 18 are connected to output terminals 36, 38 of acoustic galvanic isolator 10.

Electrically-isolating acoustic coupler 16 has a band-pass frequency response that will be described in more detail below with reference to FIG. 3. Local oscillator 12 generates carrier signal $S_C$ at a frequency nominally at the center of the pass band of electrically-isolating acoustic coupler 16. In one exemplary embodiment of acoustic galvanic isolator 10, the pass band of electrically-isolating acoustic coupler 16 is centered at a frequency of 1.9 GHz, and local oscillator 12 generated carrier signal $S_C$ at a frequency of 1.9 GHz. Local oscillator 12 feeds carrier signal $S_C$ to the carrier signal input of modulator 14.

Modulator 14 receives electrical information signal $S_I$ from input terminals 22, 24 and modulates carrier signal $S_C$ with electrical information signal $S_I$ to generate modulated electrical signal $S_M$. Typically, modulated electrical signal $S_M$ is carrier signal $S_C$ modulated in accordance with electrical information signal $S_I$. Any suitable modulation scheme may be used. In an example in which carrier signal is amplitude modulated by electrical information signal $S_I$ and electrical information signal $S_I$ is a digital signal having low and high signal levels respectively representing 0s and 1s, modulated electrical signal $S_M$ has small and large amplitudes respectively representing the 0s and 1s of the electrical information signal.

As will be described in more detail below with reference to FIGS. 2 and 4A-4C, electrically-isolating acoustic coupler 16 acoustically couples modulated electrical signal $S_M$ from its inputs 26, 28 to its outputs 32, 34 to provide an electrical output signal $S_O$ to the inputs of demodulator 18. Electrical output signal $S_O$ is similar to modulated electrical signal $S_M$, i.e., it is a modulated electrical signal having the same frequency as carrier signal $S_C$, the same modulation scheme as modulated electrical signal $S_M$ and the same information content as electrical information signal $S_I$. Demodulator 18 demodulates electrical output signal $S_O$ to recover electrical information signal $S_I$ as recovered electrical information signal $S_R$. Recovered electrical information signal $S_R$ is output from demodulator 18 to output terminals 36, 38.

Demodulator 18 comprises a detector (not shown) that recovers electrical information signal $S_I$ from electrical output signal $S_O$ as is known in the art. In an example, the detector rectifies and integrates electrical output signal $S_O$ to recover electrical information signal $S_I$. Typically, in an embodiment intended for applications in which electrical information signal $S_I$ is a digital signal, demodulator 18 additionally includes a clock and data recovery (CDR) circuit following the detector. The CDR circuit operates to clean up the waveform of the raw electrical information signal recovered from the electrical output signal $S_O$ to generate recovered electrical information signal $S_R$. Demodulator 18 provides the recovered electrical information signal $S_R$ to the output terminals 36, 38 of acoustic galvanic isolator 10.

Circuits suitable for use as local oscillator 12, modulator 14 and demodulator 18 of acoustic galvanic isolator 10 are known in the art. Consequently, local oscillator 12, modulator 14 and demodulator 18 will not be described in further detail.

In the embodiment shown in FIG. 1, local oscillator 12 is shown as part of acoustic galvanic isolator 10. In other embodiments, instead of a local oscillator, acoustic galvanic isolator 10 has carrier signal input terminals (not shown) via which the acoustic galvanic isolator receives the carrier signal $S_C$ from an external carrier signal generator. In such embodiments, the carrier signal input terminals provide the carrier signal source for the acoustic galvanic isolator.

Acoustic couplers in according with embodiments of the invention that can be used as acoustically-isolating acoustic coupler 16 in acoustic galvanic isolator 10 will now be described. Such embodiments all have a band-pass frequency response, as will be described in more detail below with reference to FIG. 3. The pass-band of the acoustic coupler is characterized by a center frequency and a bandwidth. The bandwidth of the pass-band determines the maximum data rate of the information signal that can be acoustically coupled by the acoustic coupler. For simplicity, the center frequency of the pass band of the acoustic coupler will be referred to as the center frequency of the acoustic coupler. As will be described further below, the acoustic coupler embodiments are composed in part of layers of various acoustically-transmissive materials whose thickness depends on the wavelength in the acoustically-transmissive material of an acoustic signal nominally equal in frequency to the center frequency of the acoustic coupler. In acoustic galvanic isolator 10 shown in FIG. 1, the frequency of carrier signal $S_C$ is nominally equal to the center frequency of the acoustic coupler used as electrically-isolating acoustic coupler 16.

In this disclosure, the term quarter-wave layer will be used to denote a layer of acoustically-transmissive material having a nominal thickness t equal to an odd integral multiple of one quarter of the wavelength in the material of an acoustic signal nominally equal in frequency to the center frequency of the acoustic coupler, i.e.:

$$t \approx (2m+1)\lambda_n/4 \quad (1)$$

where $\lambda_n$ is the wavelength of the above-mentioned acoustic signal in the acoustically-transmissive material and m is an integer equal to or greater than zero. The thickness of a quarter-wave layer may differ from the nominal thickness by approximately ±10% of $\lambda_n/4$. A thickness outside this tolerance range can be used with some degradation in performance, but the thickness of a quarter-wave layer always differs significantly from an integral multiple of $\lambda_n/2$.

Moreover, in this disclosure, a quarter wave layer having a thickness equal to a specific number of quarter wavelengths of the above-mentioned acoustic signal in the material of the layer will be denoted by preceding the term quarter-wave layer by a number denoting the number of quarter wavelengths. For example, the term one quarter-wave layer will be used to denote a layer of acoustically-transmissive material having a nominal thickness t equal to one quarter of the wavelength in the material of an acoustic signal equal in frequency to the center frequency of the acoustic coupler, i.e., $t \approx \lambda_n/4$ (m=0 in equation (1)). A one quarter-wave layer is a quarter-wave layer of a least-possible thickness. Similarly, a three quarter-wave layer has a nominal thickness t equal to three quarters of the wavelength in the material of the above-mentioned acoustic signal, i.e., $t \approx 3\lambda_n/4$ (m=1 in equation (1)).

The term half-wave layer will be used to denote a layer of acoustically-transmissive material having a nominal thickness t equal to an integral multiple of one half of the wavelength in the material of an acoustic signal equal in frequency to the center frequency of the acoustic coupler, i.e.:

$$t \approx n\lambda_n/2 \quad (2)$$

where n is an integer greater than zero. The thickness of a half-wave layer may differ from the nominal thickness by approximately ±10% of $\lambda_n/2$. A thickness outside this tolerance range can be used with some degradation in performance, but the thickness of a half-wave layer always differs significantly from an odd integral multiple of $\lambda_n/4$. The term half-wave layer may be preceded with a number to denote a layer having a thickness equal to a specific number of half wavelengths of the above-mentioned acoustic signal in the material of the layer.

Acoustic galvanic isolators and their constituent electrically-isolating acoustic couplers are characterized by a breakdown voltage. The breakdown voltage of an acoustic galvanic isolator is the voltage that, when applied between the input terminals and output terminals of the acoustic galvanic isolator, causes a leakage current greater than a threshold leakage current to flow. In acoustic galvanic isolators with multiple input terminals and multiple output terminals, as in this disclosure, the input terminals are electrically connected to one another and the output terminals are electrically connected to one another to make the breakdown voltage measurement. The breakdown voltage of an electrically-isolating acoustic coupler is the voltage that, when applied between the inputs and outputs of the acoustically-resonant electrical insulator, causes a leakage current greater than a threshold leakage current to flow. In electrically-isolating acoustic couplers with multiple inputs and multiple outputs, as in this disclosure, the inputs are electrically connected to one another and the outputs are electrically connected to one another to make the breakdown voltage measurement. The threshold leakage current is application-dependent, and is typically of the order of microamps.

Figure 2:
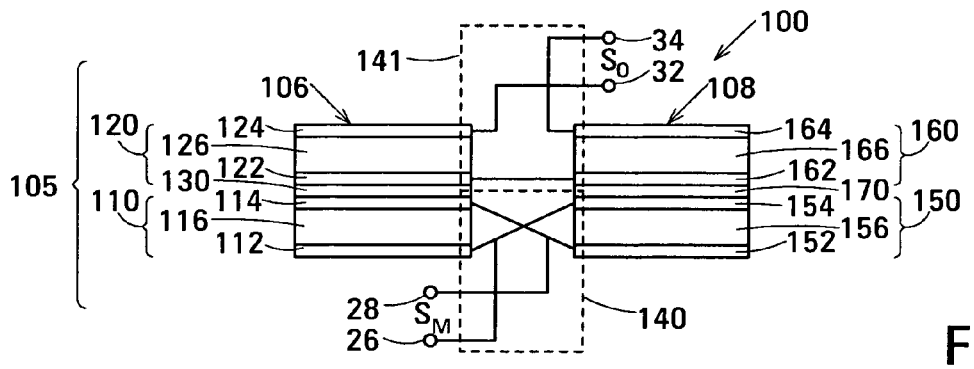
FIG. 2 is a schematic diagram showing an example of an acoustic coupler in accordance with a first embodiment of the invention that may be used as the electrically-isolating acoustic coupler of the acoustic galvanic isolator shown in FIG. 1.

FIG. 2 is a schematic diagram showing an example of an acoustic coupler 100 in accordance with a first embodiment of the invention. Acoustic coupler 100 comprises inputs 26, 28, outputs 32, 34, and an electrically-isolating film acoustically-coupled transformer (FACT) 105. FACT 105 is composed of a first decoupled stacked bulk acoustic resonator (DSBAR) 106 and a second DSBAR 108, an electrical circuit 140 that interconnects DSBAR 106 and DSBAR 108 and that additionally connects DSBARs 106 and 108 to inputs 26, 28, and an electrical circuit 141 that interconnects DSBAR 106 and DSBAR 108 and that additionally connects DSBARs 106 and 108 to outputs 32, 34. In electrically-isolating FACT 105, at least the piezoelectric element of one of the film bulk acoustic resonators (FBARs) of each of the DSBARs 106 and 108 provides electrical isolation between inputs 26, 28 and outputs 32, 34.

When used as electrically-isolating acoustic coupler 16 in acoustic galvanic isolator 10 shown in FIG. 1, acoustic coupler 100 acoustically couples modulated electrical signal $S_M$ from inputs 26, 28 to outputs 32, 34 while providing electrical isolation between inputs 26, 28 and outputs 32, 34. Thus, acoustic coupler 100 effectively galvanically isolates output terminals 36, 38 from input terminals 22, 24, and allows the output terminals to differ in voltage from the input terminals by a voltage up to its specified breakdown voltage. Additionally, acoustic coupler 100 and the other acoustic coupler embodiments described herein provide common mode rejection between inputs 26, 28 and outputs 32, 34. Finally, in acoustic coupler 100 and the other acoustic coupler embodiments described herein, at least one of the piezoelectric elements of each of DSBAR 106 and 108 additionally provides electrical isolation between inputs 26, 28 and outputs 32, 34.

In electrically-isolating FACT 105, each of DSBAR 106 and DSBAR 108 is composed of a stacked pair of film bulk acoustic resonators (FBARs) and an acoustic decoupler between the FBARs. DSBAR 106 is composed of a lower film bulk acoustic resonator (FBAR) 110, an upper FBAR 120 stacked on FBAR 10, and an acoustic decoupler 130 between lower FBAR 110 and upper FBAR 120. DSBAR 108 is composed of a lower FBAR 150, an upper FBAR 160 stacked on FBAR 150, and an acoustic decoupler 170 between lower FBAR 150 and upper FBAR 160. In some embodiments, acoustic decouplers 130 and 170 are electrically insulating and provide additional electrical isolation.

FBAR 110 is composed of opposed planar electrodes 112 and 114 and a piezoelectric element 116 between the electrodes. FBAR 120 is composed of opposed planar electrodes 122 and 124 and a piezoelectric element 126 between the electrodes. Acoustic decoupler 130 is located between electrode 114 of FBAR 110 and electrode 122 of FBAR 120. FBAR 150 is composed of opposed planar electrodes 152 and 154 and a piezoelectric element 156 between the electrodes. FBAR 160 is composed of opposed planar electrodes 162 and 164 and a piezoelectric element 166 between the electrodes. Acoustic decoupler 170 is located between electrode 154 of FBAR 150 and electrode 162 of FBAR 160.

Electrical circuit 140 electrically connects FBAR 110 of DSBAR 106 in anti-parallel with FBAR 150 of DSBAR 108 and to inputs 26 and 28. Specifically, electrical circuit 140 electrically connects electrode 112 of FBAR 110 to electrode 154 of FBAR 150 and to input 26 and additionally electrically connects electrode 114 of FBAR 110 to electrode 152 of FBAR 150 and to input 28. Electrical circuit 141 electrically connects FBAR 120 of DSBAR 106 and FBAR 160 of DSBAR 108 in series between outputs 32 and 34. Specifically, electrical circuit 141 connects output 32 to electrode 124 of FBAR 120, electrode 122 of FBAR 120 to electrode 162 of FBAR 160 and electrode 164 of FBAR 160 to output 34.

Electrical circuit 140 electrically connects FBARs 110 and 150 in anti-parallel so that it applies modulated electrical signal $S_M$ received at inputs 26, 28 to FBARs 110 and 150 equally but in antiphase. FBARs 110 and 150 convert modulated electrical signal $S_M$ to respective acoustic signals. Electrical circuit 140 electrically connects FBARs 110 and 150 in anti-parallel such that it applies modulated electrical signal $S_M$ to FBAR 110 in a sense that causes FBAR 110 to contract mechanically whereas it applies modulated electrical signal $S_M$ to FBAR 150 in a sense that causes FBAR 150 to expand mechanically by the same amount, and vice versa. The acoustic signal generated by FBAR 150 is therefore in antiphase with the acoustic signal generated by FBAR 110. Consequently, the acoustic signal received by FBAR 160 from FBAR 150 is in antiphase with the acoustic signal received by FBAR 120 from FBAR 110. FBARs 120 and 160 convert the acoustic signals they receive back to respective electrical signals. The electrical signal generated by FBAR 160 is in antiphase with the electrical signal generated by FBAR 120. Electrical circuit 141 connects FBARs 120 and 160 in series such that the voltages across the FBARs add, and the voltage difference between electrodes 124 and 164 and, hence between outputs 32, 34, is twice the voltage across each of FBARs 120 and 160. The electrical output signal $S_O$ appearing between outputs 32, 34 has the same frequency and includes the information content of the modulated electrical signal $S_M$ applied between inputs 26, 28. Thus, acoustic coupler 100 effectively acoustically couples the modulated electrical signal $S_M$ from inputs 26, 28 to outputs 32, 34.

Outputs 32, 34 are electrically insulated from inputs 26, 28 at least by piezoelectric elements 126 and 166. Typical piezoelectric elements have a high electrical resistivity and breakdown field. For example, samples of sputter-deposited aluminum nitride have a measured breakdown field of about 875 kV/mm. Accordingly, acoustic coupler 100 provides electrical isolation between inputs 26, 28 and outputs 32, 34. In embodiments in which acoustic decouplers 130 and 170 are electrically insulating, acoustic decouplers 130 and 170 are electrically in series with piezoelectric elements 126 and 166, respectively, and provide additional isolation.

In acoustic coupler 100, acoustic decoupler 130 controls the coupling of the acoustic signal generated by FBAR 110 to FBAR 120 and acoustic decoupler 170 controls the coupling of the acoustic signal generated by FBAR 150 to FBAR 160. Acoustic couplers 130 and 170 control the bandwidth of acoustic coupler 100. Specifically, due to a substantial mismatch in acoustic impedance between acoustic decoupler 130 and FBARs 110 and. 120, acoustic decoupler 130 couples less of the acoustic signal from FBAR 110 to FBAR 120 than would be coupled by direct contact between FBARs 110 and 120. Similarly, due to a substantial mis-match in acoustic impedance between acoustic decoupler 170 and FBARs 150 and 160, acoustic decoupler 170 couples less of the acoustic signal from FBAR 150 to FBAR 160 than would be coupled by direct contact between FBARs 150 and 160.

Figure 3:
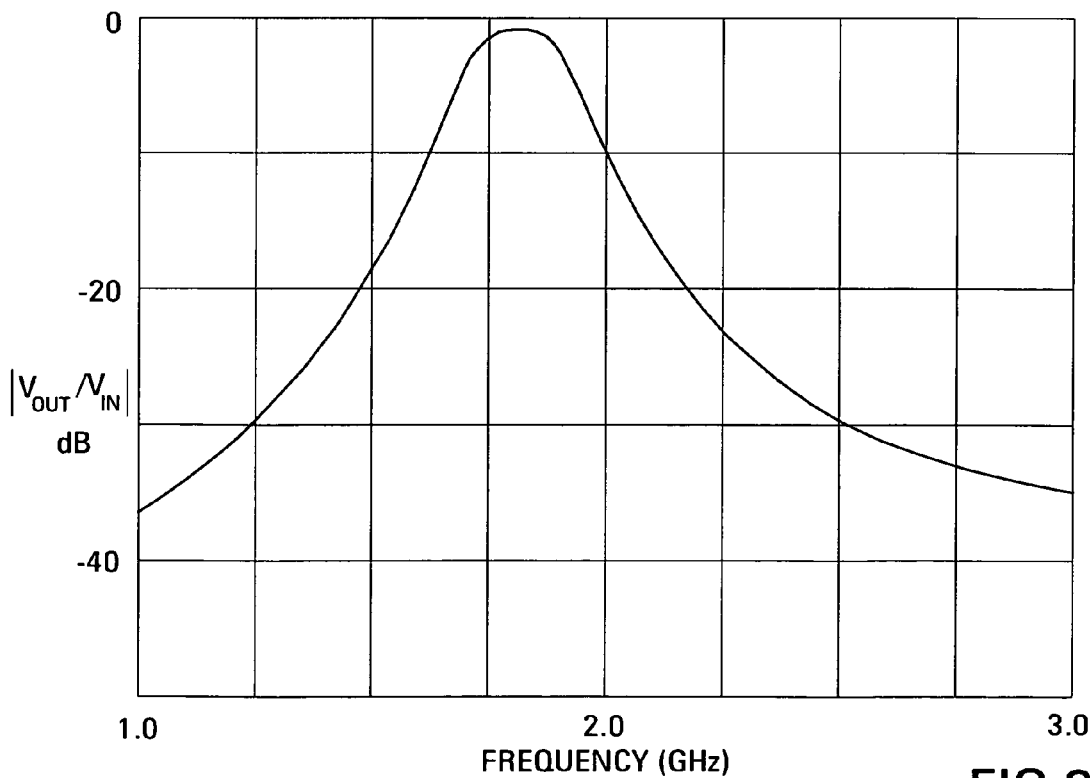
FIG. 3 is a graph showing the frequency response characteristic of an exemplary embodiment of the film acoustically-coupled transformer (FACT) that forms part of the acoustic coupler shown in FIG. 2.

FIG. 3 shows the frequency response characteristic of an exemplary embodiment of acoustic coupler 100. Acoustic coupler 100 exhibits a flat in-band response with a pass bandwidth of greater than 100 MHz, which is sufficiently broad to transmit the full bandwidth of an embodiment of modulated electrical signal $S_M$ resulting from modulating carrier signal $S_C$ with an embodiment of electrical information signal $S_I$ having a data rate greater than 100 Mbit/s. The frequency response of acoustic coupler 100 additionally exhibits a sharp roll-off outside the pass band.

Figure 4A:
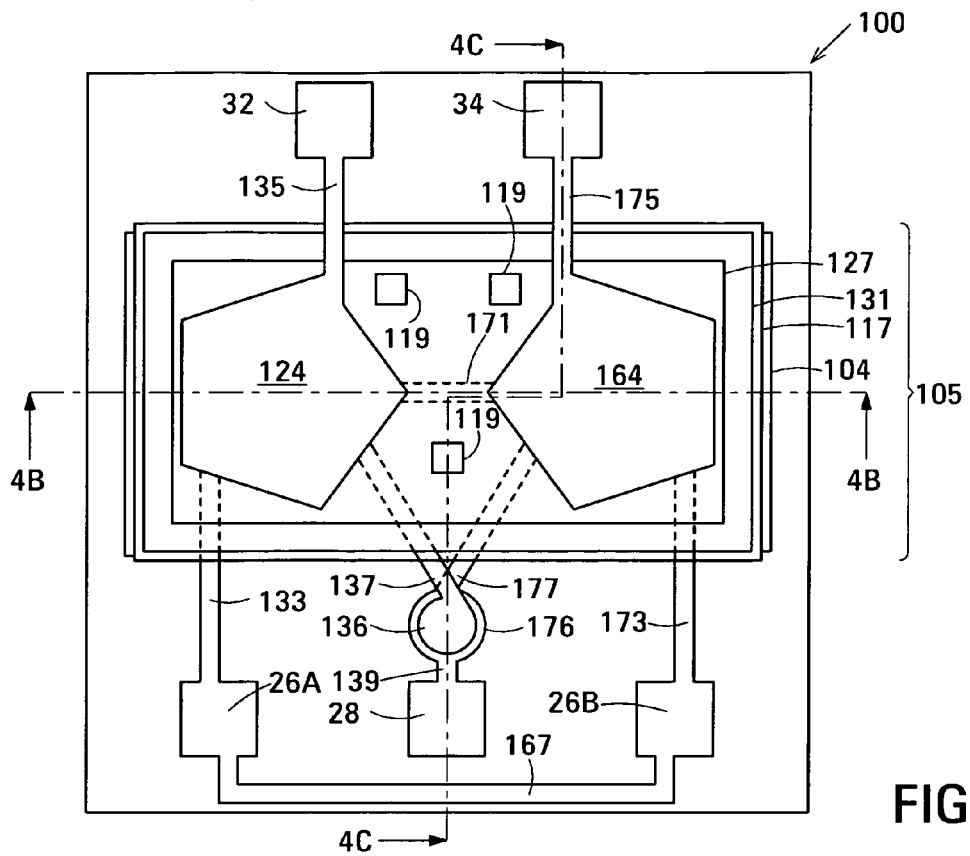
FIG. 4A is a plan view showing a practical example of the acoustic coupler shown in FIG. 2.
Figure 4B:
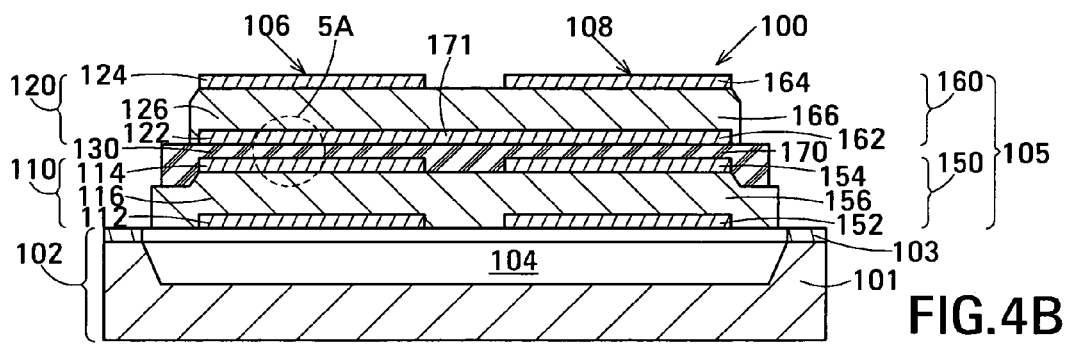
FIGS. 4B and 4C are cross-sectional views along section lines 4B-4B and 4C-4C, respectively, shown in FIG. 4A.
Figure 4C:
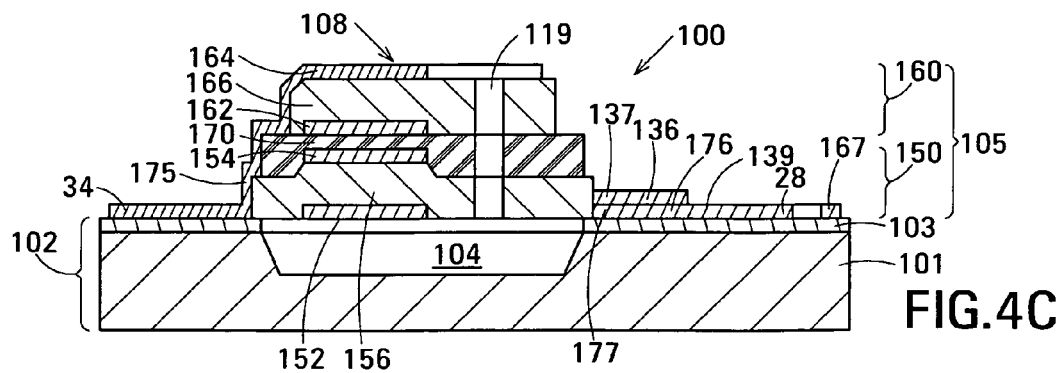

FIG. 4A is a schematic plan view showing a practical example of acoustic coupler 100. FIGS. 4B and 4C are cross-sectional views along section lines 4B-4B and 4C-4C, respectively, shown in FIG. 4A. The same reference numerals are used to denote the elements of acoustic coupler 100 in FIG. 2 and in FIGS. 4A-4C.

In the embodiment of acoustic coupler 100 shown in FIGS. 4A-4C, DSBAR 106 and DSBAR 108 constituting FACT 105 are suspended over a common cavity 104 defined in a substrate 102. Suspending DSBARs 106 and 108 over cavity 104 allows the stacked FBARs 110 and 120 constituting DSBAR 106 and the stacked FBARs 150 and 160 constituting DSBAR 108 to resonate mechanically in response to modulated electrical signal $S_M$. Other suspension schemes that allow DSBARs 106 and 108 to resonate mechanically are possible. For example, DSBAR 106 and DSBAR 108 may be suspended over respective cavities (not shown) defined in substrate 102. In another example, DSBAR 106 and DSBAR 108 are acoustically isolated from substrate 102 by an acoustic Bragg reflector (not shown), as described by John D. Larson III et al. in United States patent application publication no. 2005 0 104 690 entitled Cavity-Less Film Bulk Acoustic Resonator (FBAR) Devices, assigned to the assignee of this disclosure and incorporated by reference.

In the example shown in FIGS. 4A-4C, the material of substrate 102 is single-crystal silicon. Since single-crystal silicon is a semiconductor and is therefore not a good electrical insulator, substrate 102 is typically composed of a base layer 101 of single crystal silicon and an insulating layer 103 of dielectric material located on the major surface of the base layer. Exemplary materials of the insulating layer include aluminum nitride (AlN), silicon nitride ($Si_3N_4$), silicon dioxide ($SiO_2$), a polyimide, a crosslinked polyphenylene polymer and any other suitable electrically-insulating material. Insulating layer 103 insulates DSBARs 106 and 108 and electrical circuit 140 and 141 from base layer 101. Alternatively, the material of substrate 102 can be a ceramic material, such as alumina ($Al_2O_3$), that has a very high electrical resistivity and breakdown field.

In the example shown in FIGS. 4A-4C, a piezoelectric layer 117 of piezoelectric material provides piezoelectric elements 116 and 156 and a piezoelectric layer 127 of piezoelectric material provides piezoelectric elements 126 and 166. Additionally, in the example shown in FIGS. 4A-4C, a single acoustic decoupling layer 131 of acoustic decoupling material provides acoustic decouplers 130 and 170, as will be described in more detail below with reference to FIG. 5A.

In the example shown in FIGS. 4A-4C, input 26 shown in FIG. 2 is embodied as terminal pads 26A and 26B, and input 28 shown in FIG. 2 is embodied as a terminal pad 28. Terminal pads 26A, 26B and 28 are located on the major surface of substrate 102. Electrical circuit 140 shown in FIG. 2 is composed of an electrical trace 133 that extends from terminal pad 26A to electrode 112 of FBAR 110, an electrical trace 173 that extends from terminal pad 26B to electrode 154 of FBAR 150 and an electrical trace 167 that extends between terminal pads 26A and 26B. Additionally, a connection pad 176, an electrical trace 139 that extends from terminal pad 28 to connection pad 176, and an electrical trace 177 that extends from connection pad 176 to electrode 152 of FBAR 150 collectively constitute the portion of electrical circuit 140 (FIG. 2) that connects electrode 152 of FBAR 150 to terminal pad 28. Electrical trace 139, a connection pad 136 in electrical contact with connection pad 176 and an electrical trace 137 extending from connection pad 136 to electrode 114 of FBAR 110 collectively constitute the portion of electrical circuit 140 (FIG. 2) that connects electrode 114 of FBAR 110 to terminal pad 28. Electrical traces 133, 137, 173 and 177 all extend over part of the major surface of substrate 102. Additionally, electrical traces 133 and 177 extend under part of piezoelectric layer 117 and electrical traces 137 and 173 extend over part of piezoelectric layer 117.

Outputs 32, 34 are embodied as terminal pads 32, 34, respectively, located on the major surface of substrate 102. Electrical circuit 141 shown in FIG. 2 is composed of an electrical trace 135 that extends from terminal pad 32 to electrode 124 of FBAR 120, an electrical trace 171 that extends from electrode 122 of FBAR 120 to electrode 162 of FBAR 160, and an electrical trace 175 that extends from terminal pad 34 to electrode 164 of FBAR 160. Electrical traces 135 and 175 each extend over parts of the major surfaces of piezoelectric layer 127, acoustic decoupling layer 131, piezoelectric layer 117 and substrate 102. Electrical trace 171 extends over parts of the major surface of acoustic decoupling layer 131.

Substantially the same capacitance exists between each of the inputs 26, 28 and substrate 102. Each of the inputs 26, 28 has connected to it one electrode adjacent substrate 102 and one electrode separated from substrate 102 by a respective piezoelectric element. In the example shown, input 26 is connected to electrode 112 adjacent the substrate and electrode 154 separated from the substrate by piezoelectric element 156, and input 28 is connected to electrode 152 adjacent the substrate and electrode 114 separated from the substrate by piezoelectric element 116. Moreover, substantially the same capacitance exists between each of the outputs 32, 34 and substrate 102. Outputs 32, 34 are connected to electrodes 124 and 164, each of which is separated from the substrate by two piezoelectric elements and an acoustic decoupler. Thus, acoustic coupler 100 is electrically balanced and, as a result, has a high common-mode rejection ratio.

In embodiments of acoustic galvanic isolator 10 (FIG. 1) in which local oscillator 12, modulator 14 and demodulator 18 are fabricated in and on substrate 102, terminal pads 26, 28, 32, 34 are typically omitted and electrical traces 133, 139 and 173 are extended to connect to corresponding traces constituting part of modulator 14 and electrical traces 135 and 175 are extended to connect to corresponding traces constituting part of demodulator 18.

FIG. 5A is an enlarged view of the portion marked 5A in FIG. 4B showing a first embodiment of acoustic decoupler 130. The following description of acoustic decoupler 130 also applies to acoustic decoupler 170. Consequently, acoustic decoupler 170 will not be separately described. In the embodiment shown in FIG. 5A, acoustic decoupler 130 is composed of an acoustic decoupling layer 131 of acoustic decoupling material. Acoustic decoupling layer 131 is located between the electrodes 114 and 122 of FBARs 110 and 120, respectively, to provide acoustic decoupler 130. Acoustic decoupling layer 131 is additionally located between electrodes 154 and 162 of FBARs 150 and 160, respectively, to provide acoustic decoupler 170. Alternatively, separate acoustic decoupling layers (not shown) may be used to provide acoustic decouplers 130 and 170.

The acoustic decoupling material of acoustic decoupling layer 131 has an acoustic impedance intermediate between that of air and that of the materials of FBARs 110 and 120. In embodiments in which acoustic decoupler 130 is electrically insulating, the acoustic decoupling material of acoustic decoupling layer 131 additionally has a high electrical resistivity and a high breakdown voltage.

The acoustic impedance of a material is the ratio of stress to particle velocity in the material and is measured in Rayleighs, abbreviated as rayl. The piezoelectric material of the piezoelectric elements 116 and 126 of FBARs 110 and 120, respectively is typically aluminum nitride (AlN) and the material of electrodes 112, 114, 122 and 124 is typically molybdenum (Mo). The piezoelectric material of the piezoelectric elements 156 and 166 of FBARs 150 and 160, respectively is typically aluminum nitride (AlN) and the material of electrodes 152, 154, 162 and 164 is typically molybdenum (Mo). The acoustic impedance of AlN is typically about 35 Mrayl and that of molybdenum is about 63 Mrayl. The acoustic impedance of air is about 1 krayl.

Typically, the acoustic impedance of the acoustic decoupling material of acoustic decoupling layer 131 is about one order of magnitude less that of the piezoelectric material that constitutes the piezoelectric elements 116 and 126 of FBARs 110 and 120, respectively. The bandwidth of the pass band of acoustic coupler 100 depends on the difference in acoustic impedance between the acoustic decoupling material of acoustic decoupling layer 131 and the materials of FBARs 110 and 120. In embodiments of acoustic decoupler 100 in which the materials of FBARs 110 and 120 are as stated above, acoustic decoupling materials with an acoustic impedance in the range from about 2 Mrayl to about 8 Mrayl will result in acoustic decoupler having a pass bandwidth sufficient to allow acoustic galvanic isolator 10 (FIG. 1) to operate at data rates greater than 100 Mb/s.

In acoustic galvanic isolator 10, (FIG. 1) the main factors that determine the breakdown voltage between input terminals 22, 24 and output terminals 36, 38 are the electrical breakdown field of the piezoelectric material of piezoelectric layer 127 and the thickness of piezoelectric layer 127. In embodiments in which acoustic coupler 100 has an insulating acoustic decoupling layer 131, as is typical, the breakdown voltage is increased by an amount that depends on the electrical breakdown field of the acoustic decoupling material of acoustic decoupling layer 131 and the thickness of acoustic decoupling layer 131.

For a given acoustic decoupling material, an embodiment of acoustic coupler 100 having a layer thicker than a one quarter-wave layer as acoustic decoupling layer 131 typically increases the breakdown voltage of acoustic coupler 100 by more than an embodiment having a one quarter-wave layer as acoustic decoupling layer 131. However, an embodiment of acoustic coupler 100 in which acoustic decoupling layer 131 is thicker than a one quarter-wave layer typically has a frequency response that exhibits spurious response artifacts due to the ability of such thicker acoustic decoupling layer to support multiple acoustic modes. The spurious response artifacts tend to reduce the opening of the "eye" of the electrical output signal $S_O$ output by acoustic coupler 100. To ensure the integrity of the recovered electrical information signal $S_R$ output by acoustic galvanic isolator 10 (FIG. 1), embodiments in which acoustic coupler 100 has a layer thicker than a one quarter-wave layer as acoustic decoupling layer 131 typically need a more sophisticated type of clock and data recovery circuit in demodulator 18 than embodiments in which acoustic coupler 100 has a one quarter-wave layer (m=0) as acoustic decoupling layer 131. Embodiments of acoustic coupler 100 in which acoustic decoupling layer 131 is a one quarter-wave layer typically couple modulated electrical signal $S_M$ from inputs 26, 28 to outputs 32, 34 with optimum signal integrity.

Acoustic decoupling layer 131 is formed by spin coating a liquid precursor for the acoustic decoupling material over electrodes 114 and 154. An acoustic decoupling layer formed by spin coating will typically have regions of different thickness due to the contouring of the surface coated by the acoustic decoupling material. In such embodiments, the thickness of acoustic decoupling layer 131 is the thickness of the portion of the acoustic decoupling layer located between electrodes 114 and 122 and between electrodes 154 and 162.

Many materials are electrically insulating, have high breakdown fields and have acoustic impedances in the range stated above. Additionally, many such materials can be applied in layers of uniform thickness in the thickness ranges stated above. Such materials are therefore potentially suitable for use as the acoustic decoupling material of acoustic decoupling layer 131. However, the acoustic decoupling material must also be capable of withstanding the high temperatures of the fabrication operations performed after acoustic decoupling layer 131 has been deposited to form acoustic decouplers 130 and 170. In practical embodiments of acoustic coupler 100, electrodes 122, 124, 162 and 164 and piezoelectric layer 127 are deposited by sputtering after the acoustic decoupling material has been deposited. Temperatures as high as 400° C. are reached during these deposition processes. Thus, a material that remains stable at such temperatures is used as the acoustic decoupling material.

Typical acoustic decoupling materials have a very high acoustic attenuation per unit length compared with the other materials of FBARs 110, 120, 150 and 160. However, since the acoustic decoupling layer 131 is typically less than 1 μm thick, the acoustic attenuation introduced by acoustic decoupling layer 131 of acoustic decoupling material is typically negligible.

In one embodiment, a polyimide is used as the acoustic decoupling material of acoustic decoupling layer 131. Polyimide is sold under the trademark Kapton® by E. I. du Pont de Nemours and Company. In such embodiment, acoustic decoupler 130 and acoustic decoupler 170 are provided by acoustic decoupling layer 131 of polyimide applied by spin coating. Polyimide has an acoustic impedance of about 4 Mrayl and a breakdown field of about 165 kV/mm.

In another embodiment, a poly(para-xylylene) is used as the acoustic decoupling material of acoustic decoupling layer 131. In such embodiment, acoustic decoupler 130 and acoustic decoupler 170 are provided by acoustic decoupling layer 131 of poly(para-xylylene) applied by vacuum deposition. Poly(para-xylylene) is also known in the art as parylene. The dimer precursor di-para-xylylene from which parylene is made and equipment for performing vacuum deposition of layers of parylene are available from many suppliers. Parylene has an acoustic impedance of about 2.8 Mrayl and a breakdown field of about 275 kV/mm.

In another embodiment, a crosslinked polyphenylene polymer is used as the acoustic decoupling material of acoustic decoupling layer 131. In such embodiment, acoustic decoupler 130 and acoustic decoupler 170 are provided by acoustic decoupling layer 131 of the crosslinked polyphenylene polymer to electrode 114 applied by spin coating. Crosslinked polyphenylene polymers have been developed as low dielectric constant dielectric materials for use in integrated circuits and consequently remain stable at the high temperatures to which the acoustic decoupling material is subject during the subsequent fabrication of FBARs 120 and 160. Crosslinked polyphenylene polymers have a calculated acoustic impedance of about 2 Mrayl. This acoustic impedance is in the range of acoustic impedances that provides acoustic coupler 100 with a pass bandwidth sufficient for operation at data rates of over 100 Mbit/s.

Precursor solutions containing various oligomers that polymerize to form respective crosslinked polyphenylene polymers are sold by The Dow Chemical Company, Midland, Mich., under the registered trademark SiLK. The precursor solutions are applied by spin coating. The crosslinked polyphenylene polymer obtained from one of these precursor solutions designated SiLK™ J, which additionally contains an adhesion promoter, has a calculated acoustic impedance of 2.1 Mrayl, i.e., about 2 Mrayl. This crosslinked polyphenylene polymer has a breakdown field of about 400 kV/mm.

The oligomers that polymerize to form crosslinked polyphenylene polymers are prepared from biscyclopentadienone- and aromatic acetylene-containing monomers. Using such monomers forms soluble oligomers without the need for undue substitution. The precursor solution contains a specific oligomer dissolved in gamma-butyrolactone and cyclohexanone solvents. The percentage of the oligomer in the precursor solution determines the layer thickness when the precursor solution is spun on. After application, applying heat evaporates the solvents, then cures the oligomer to form a cross-linked polymer. The biscyclopentadienones react with the acetylenes in a 4+2 cycloaddition reaction that forms a new aromatic ring. Further curing results in the cross-linked polyphenylene polymer. The above-described crosslinked polyphenylene polymers are disclosed by Godschalx et al. in U.S. Pat. No. 5,965,679, incorporated herein by reference. Additional practical details are described by Martin et al., *Development of Low-Dielectric Constant Polymer for the Fabrication of Integrated Circuit Interconnect,* 12 ADVANCED MATERIALS, 1769 (2000), also incorporated by reference. Compared with polyimide, crosslinked polyphenylene polymers are lower in acoustic impedance, lower in acoustic attenuation, lower in dielectric constant and higher in breakdown field. Moreover, a spun-on layer of the precursor solution is capable of producing a high-quality film of the crosslinked polyphenylene polymer with a thickness of the order of 200 nm, which is a typical thickness of acoustic decoupling layer 131.

In an alternative embodiment, the acoustic decoupling material of acoustic decoupling layer 131 providing acoustic decoupler 130 and acoustic decoupler 170 is a material whose acoustic impedance is substantially greater than that of the materials of FBARs 110, 120, 150 and 160. No materials having this property are known at this time, but such materials may become available in future, or lower acoustic impedance FBAR materials may become available in future. The thickness of a quarter-wave layer of such high acoustic impedance acoustic decoupling material is as described above.

FIG. 5B is an enlarged view of the portion marked 5A in FIG. 4B showing a second embodiment of acoustic decoupler 130. The following description of acoustic decoupler 130 also applies to acoustic decoupler 170. Consequently, acoustic decoupler 170 will not be separately described. In the embodiment shown in FIG. 5B, acoustic decoupler 130 is composed of an acoustic Bragg structure 161 located between electrode 114 of FBAR 110 and electrode 122 of FBAR 120. Acoustic Bragg structure 161 comprises a low acoustic impedance Bragg element 163 located between high acoustic impedance Bragg elements 165 and 167. The electrical isolation provided by piezoelectric layer 127 allows Bragg structure 161 to comprise all electrically-conducting Bragg elements. However, an embodiment of acoustic coupler 100 in which at least one of the Bragg elements 163, 165 and 167 of Bragg structure 161 comprises a layer of material having a high electrical resistivity, a low dielectric permittivity and a high breakdown field increases the breakdown voltage of acoustic coupler 100.

Each of the Bragg elements 163, 165 and 167 is a quarter-wave layer. Low acoustic impedance Bragg element 163 is a quarter-wave layer of a low acoustic impedance material whereas high acoustic impedance Bragg elements 165 and 167 are each a quarter-wave layer of high acoustic impedance material. The acoustic impedances of the materials of the Bragg elements are characterized as "low" and "high" with respect to one another and with respect to the acoustic impedance of the piezoelectric material of piezoelectric elements 116 and 126. Common quarter-wave layers of materials are typically used to provide Bragg structure 161 of acoustic decoupler 130 and the Bragg structure (not shown) of acoustic decoupler 170.

In one embodiment, low acoustic impedance Bragg element 163 is a quarter-wave layer of silicon dioxide ($SiO_2$), which has an acoustic impedance of about 13 Mrayl, and each of the high acoustic impedance Bragg elements 165 and 167 is a quarter-wave layer of the same material as electrodes 114 and 122, respectively, e.g., molybdenum, which has an acoustic impedance of about 63 Mrayl. Using the same material for high acoustic impedance Bragg element 165 and electrode 114 of FBAR 110 allows high acoustic impedance Bragg element 165 additionally to serve as electrode 114. Similarly, using the same material for high acoustic impedance Bragg element 167 and electrode 122 of FBAR 120 allows high acoustic impedance Bragg element 167 additionally to serve as electrode 122.

In an example, high acoustic impedance Bragg elements 165 and 167 are one quarter-wave layers of molybdenum, and low acoustic impedance Bragg element 163 is a one quarter-wave layer of $SiO_2$. In an embodiment in which the frequency of carrier signal $S_C$ is about 1.9 MHz, molybdenum high acoustic impedance Bragg elements 165 and 167 have a thickness of about 820 nm and $SiO_2$ low acoustic impedance Bragg element 163 has a thickness of about 260 nm.

An alternative material for low acoustic impedance Bragg element 163 is a crosslinked polyphenylene polymer such as the above-mentioned crosslinked polyphenylene polymer made from a precursor solution sold under the registered trademark SiLK by Dow Chemical Co. Examples of alternative materials for low acoustic impedance Bragg element 163 include zirconium oxide ($ZrO_2$), hafnium oxide (HfO), yttrium aluminum garnet (YAG), titanium dioxide ($TiO_2$) and various glasses. An alternative material for high impedance Bragg elements 165 and 167 is tungsten (W).

In the example just described, only one of the Bragg elements 163, 165 and 167 is insulating, and the breakdown voltage of acoustic coupler 100, and, hence, of acoustic galvanic isolator 10, is determined the thickness of piezoelectric layer 127 and the breakdown field of the piezoelectric material of piezoelectric layer 127 and by the thickness of low acoustic impedance Bragg element 163 and the breakdown field of the material of low acoustic impedance Bragg element 163.

The breakdown voltage of acoustic coupler 100 can be increased by making all the Bragg elements 163, 165 and 167 constituting Bragg structure 161 of electrically-insulating material. In an exemplary embodiment, high acoustic impedance Bragg elements 163 and 167 are each a quarter-wave layer of silicon dioxide and low impedance Bragg element 165 is a quarter-wave layer of a crosslinked polyphenylene polymer, such as the above-mentioned crosslinked polyphenylene polymer made from a precursor solution sold under the registered trademark SiLK by Dow Chemical Co. However, silicon dioxide has a relatively low breakdown field of about 30 kV/mm, and a quarter-wave layer of a typical crosslinked polyphenylene polymer is relatively thin due to the relatively low velocity of sound of this material. In another all-insulating embodiment of Bragg structure 161 having a substantially greater breakdown voltage, high acoustic impedance Bragg elements 163 and 167 are each a quarter-wave layer of aluminum oxide ($Al_2O_3$) and low impedance Bragg element 165 is a quarter-wave layer of silicon dioxide. Aluminum oxide has an acoustic impedance of about 44 Mrayl and a breakdown field of several hundred kilovolts/mm. Additionally, the velocity of sound in aluminum oxide is about seven times higher than in a typical crosslinked polyphenylene polymer. A given voltage applied across two quarter-wave layers of aluminum oxide and a quarter wave layer of silicon dioxide results in a much lower electric field than when applied across two quarter-wave layers of silicon dioxide and one quarter-wave layer of a crosslinked polyphenylene polymer.

Examples of alternative electrically-insulating materials for Bragg elements 163, 165 and 167 include zirconium oxide ($ZrO_2$), hafnium oxide (HfO), yttrium aluminum garnet (YAG), titanium dioxide ($TiO_2$) and various glasses. The above examples are listed in an approximate order of descending acoustic impedance. Any of the examples may be used as the material of the high acoustic impedance Bragg layers 165, 167 provided a material having a lower acoustic impedance is used as the material of the low acoustic impedance Bragg layer 163.

In embodiments of acoustic decoupler 130 in which the acoustic impedance difference between high acoustic impedance Bragg elements 165 and 167 and low acoustic impedance Bragg element 163 is relatively low, Bragg structure 161 may be composed of more than one (n) low acoustic impedance Bragg element interleaved with a corresponding number (n+1) of high acoustic impedance Bragg elements. For example, Bragg structure 161 may be composed of two low acoustic impedance Bragg elements interleaved with three high acoustic impedance Bragg elements. While none of the Bragg elements need be electrically insulating, a higher breakdown voltage is obtained when one or more of the Bragg elements is electrically insulating.

Some galvanic isolators are required to have breakdown voltages greater than one kilovolt between their input terminals and output terminals. In acoustic coupler 100 described above with reference to FIG. 2, the isolation between inputs 26, 28 and outputs 32, 34 provided by piezoelectric elements 126 and 166 and, optionally, acoustic decouplers 130 and 170 may be insufficient to allow acoustic galvanic isolator 10 (FIG. 1) to meet such breakdown voltage requirements.

Additional embodiments of an acoustic coupler in accordance with the invention will be described next. These embodiments comprise an electrically-isolating FACT in which each DSBAR is an insulating decoupled stacked bulk acoustic resonator (IDSBAR) having one or more acoustically-resonant electrical insulators located between its constituent film bulk acoustic resonators (FBARs). The one or more acoustically-resonant electrical insulators provide electrical insulation between inputs 26, 28 and outputs 32, 34 in addition to that provided by above-described piezoelectric elements 120 and 160 and, optionally, acoustic decouplers 130 and 170. Accordingly, these acoustic decoupler embodiments have a greater breakdown voltage than acoustic coupler 100 described above with reference to FIG. 2.

Figure 7A:
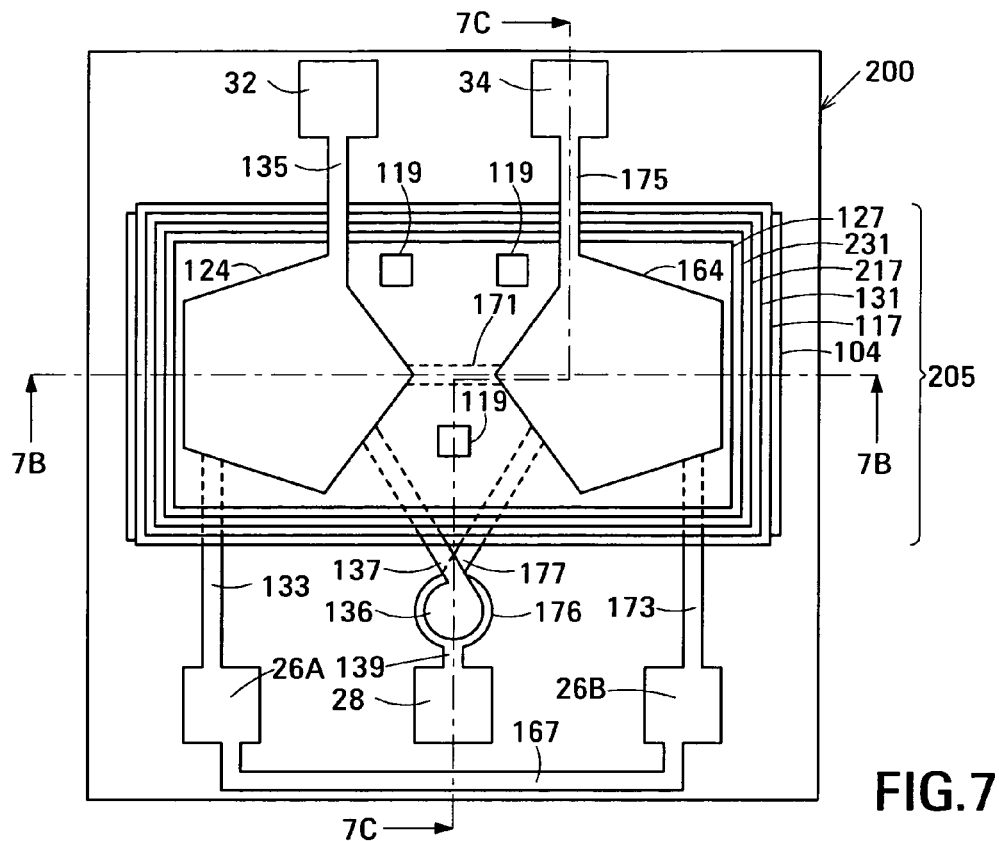
FIG. 7A is a plan view showing a practical example of the acoustic coupler shown in FIG. 6.
Figure 7B:
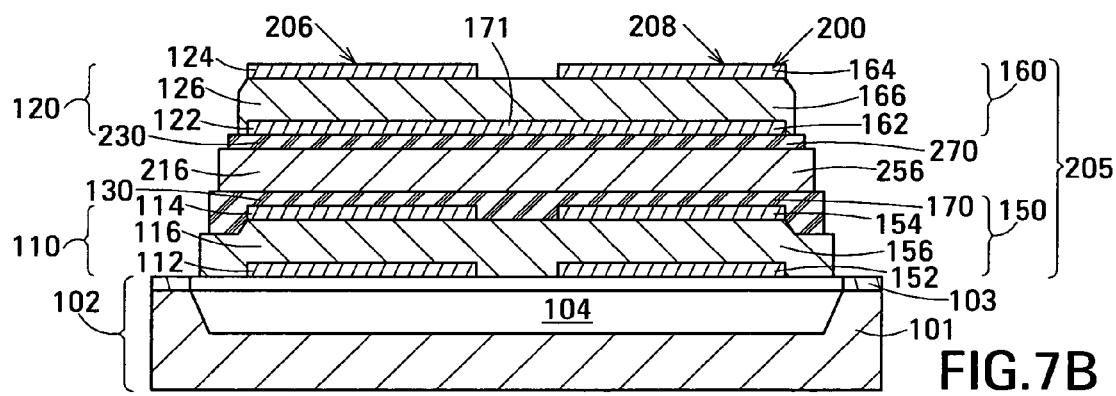
FIGS. 7B and 7C are cross-sectional views along section lines 7B-7B and 7C-7C, respectively, shown in FIG. 7A.
Figure 7C:
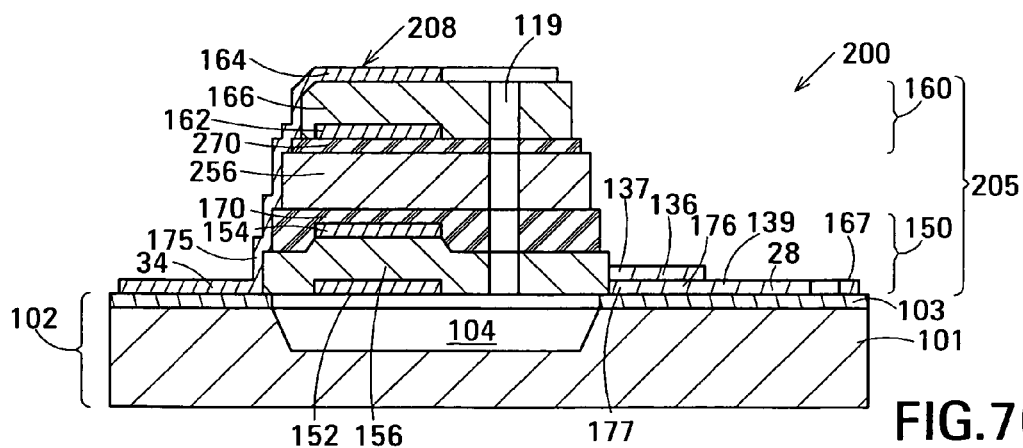

FIG. 6 is a schematic diagram showing an example of an acoustic coupler 200 in accordance with a second embodiment of the invention. FIG. 7A is a plan view of a practical example of acoustic coupler 200. FIGS. 7B and 7C are cross-sectional views along section lines 7B-7B and 7C-7C, respectively, shown in FIG. 7A. The same reference numerals are used to denote the elements of acoustic coupler 200 in FIG. 6 and in FIGS. 7A-7C.

Acoustic coupler 200 comprises inputs 26, 28, outputs 32, 34, and an electrically-isolating film acoustically-coupled transformer (FACT) 205. FACT 205 is composed of a first insulated decoupled stacked bulk acoustic resonator (IDSBAR) 206 and a second IDSBAR 208, an electrical circuit 140 that interconnects IDSBAR 206 and IDSBAR 208 and that additionally connects IDSBARs 206 and 208 to inputs 26, 28, and an electrical circuit 141 that interconnects IDSBAR 206 and IDSBAR 208 and that additionally connects IDSBARs 206 and 208 to outputs 32, 34. In electrically-isolating FACT 205, each of IDSBAR 206 and DSBAR 208 is an IDSBAR in accordance with a first IDSBAR embodiment. In its simplest form, an IDSBAR in accordance with the first IDSBAR embodiment has a first acoustic decoupler, a quarter-wave acoustically-resonant electrical insulator and a second acoustic decoupler in order between its constituent FBARs. The acoustically-resonant electrical insulator provides additional electrical insulation without impairing the transmission integrity of the modulated electrical signal $S_M$ from inputs 26, 28 to outputs 32, 34. IDSBAR 206 in accordance with the first IDSBAR embodiment gives acoustic coupler 200 a greater breakdown voltage than an otherwise similar embodiment of acoustic coupler 100 described above with reference to FIG. 2.

When used as electrically-isolating acoustic coupler 16 in acoustic galvanic isolator 10 shown in FIG. 1, acoustic coupler 200 acoustically couples modulated electrical signal $S_M$ from inputs 26, 28 to outputs 32, 34 while providing electrical isolation between inputs 26, 28 and outputs 32, 34. Thus, acoustic coupler 200 effectively galvanically isolates output terminals 36, 38 from input terminals 22, 24, and allows the output terminals to differ in voltage from the input terminals by a voltage up to its specified breakdown voltage.

In acoustic coupler 200, FACT 205 comprises an IDSBAR 206 and an IDSBAR 208, each in accordance with the first IDSBAR embodiment. Each of IDSBAR 206 and IDSBAR 208 has a first acoustic decoupler, a quarter-wave acoustically-resonant electrical insulator, and a second acoustic decoupler in order between its FBARs.

In the example of acoustic coupler 200 shown in FIGS. 6 and 7A-7C, IDSBAR 206 comprises lower film bulk acoustic resonator (FBAR) 110, upper FBAR 120 stacked on FBAR 110 and, located in order between lower FBAR 110 and upper FBAR 120, first acoustic decoupler 130, a quarter-wave acoustically-resonant electrical insulator 216, and a second acoustic decoupler 230. IDSBAR 208 comprises lower FBAR 150, upper FBAR 160 stacked on FBAR 150 and, located in order between lower FBAR 150 and upper FBAR 160, first acoustic decoupler 170, a quarter-wave acoustically-resonant electrical insulator 256, and a second acoustic decoupler 270. Other embodiments of IDSBAR 206 and IDSBAR 208 each comprise two or more (n) acoustically-resonant electrical insulators interleaved with a corresponding number (n+1) of acoustic decouplers located between the respective FBARs.

FBARs 110, 120, 150 and 160, first acoustic decouplers 130 and 170, electrical circuits 140 and 141 and substrate 102 are described above with reference to FIGS. 2 and 4A-4C and will not be described again here. The description of acoustic decouplers 130 and 170 set forth above additionally applies to acoustic decouplers 230 and 270. Accordingly, acoustic decouplers 230 and 270 will not be individually described. The exemplary embodiments of acoustic decoupler 130 described above with reference to FIGS. 5A and 5B may be used to provide each acoustic decoupler 130, 170, 230 and 270. One or more common quarter-wave layers of acoustic decoupling material may be used to provide both first acoustic decoupler 130 and first acoustic decoupler 170. In the example shown in FIGS. 7A-7C, an acoustic decoupling layer 131 of acoustic decoupling material provides first acoustic decouplers 130 and 170. Additionally, one or more common quarter-wave layers of acoustic decoupling material may be used to provide both second acoustic decoupler 230 and second acoustic decoupler 270. In the example shown in FIGS. 7A-7C, an acoustic decoupling layer 231 of acoustic decoupling material provides second acoustic decouplers 230 and 270. Alternatively, acoustic decouplers 130, 170, 230 and 270 may each be independently provided.

Quarter-wave acoustically-resonant electrical insulator 216 will now be described. The following description also applies to quarter-wave acoustically-resonant electrical insulator 256. Therefore, acoustically-resonant electrical insulator 256 and will not be individually described. Acoustically-resonant electrical insulator 216 is a quarter-wave layer of electrically-insulating material. Embodiments of acoustic coupler 200 in which acoustically-resonant electrical insulator 216 is a one quarter-wave layer typically couple modulated electrical signal $S_M$ from inputs 26, 28 to outputs 32, 34 with optimum signal integrity.

Acoustically-resonant electrical insulator 216 transmits the acoustic signal generated by FBAR 110 to FBAR 120, but electrically insulates FBAR 120 from FBAR 110. Additionally, piezoelectric element 126 electrically insulates FBAR 120 from FBAR 110 as described above. Moreover, acoustic decouplers 130 and 230 are typically electrically insulating and therefore provide additional electrical insulation between FBAR 110 and FBAR 120. Thus, acoustic coupler 200 effectively acoustically couples the modulated electrical signal $S_M$ from inputs 26, 28 to outputs 32, 34 but electrically isolates outputs 32, 34 from inputs 26, 28.

The electrically-insulating material of acoustically-resonant electrical insulator 216 is typically a dielectric or piezoelectric material nominally matched in acoustic impedance to FBARs 110 and 120. For example, the material of acoustically-resonant electrical insulator 216 is the same as that of piezoelectric elements 116 and 126 of FBARs 110 and 120 respectively. In embodiments in which the material of acoustically-resonant electrical insulator 216 differs from that of piezoelectric elements 116 and 126, the difference in acoustic impedance is substantially less than one order of magnitude. In an example, the acoustic impedances have a ratio of less than two. Different materials are used for acoustically-resonant electrical insulator 216 and piezoelectric elements 116 and 126 in an embodiment in which the material of acoustically-resonant electrical insulator 216 is a dielectric, for example. Suitable dielectric materials for acoustically-resonant electrical insulator 216 include aluminum oxide ($Al_2O_3$) and non-piezoelectric (ceramic) aluminum nitride (AlN).

Although acoustically-resonant electrical insulator 216 is optimally a one quarter-wave layer, the velocity of sound in the typical piezoelectric and dielectric materials of acoustically-resonant electrical insulator 216 is comparable with that in piezoelectric elements 126 and 166. Consequently, an acoustically-resonant electrical insulator 216 that is a one quarter-wave layer of aluminum nitride, for example, has a thickness about equal to that of piezoelectric element 126. As a result, a given voltage between inputs 26, 28 and outputs 32, 34 produces a lower electric field when applied across such an embodiment of acoustically-resonant electrical insulator 216 and piezoelectric element 126 than when applied across piezoelectric element 126 alone in acoustic coupler 100 shown in FIG. 2. Consequently, acoustic coupler 200 typically has a greater breakdown voltage than acoustic coupler 100 shown in FIG. 2.

In acoustic coupler 200, first acoustic decoupler 130 controls the coupling of the acoustic signal generated by FBAR 110 to acoustically-resonant electrical insulator 216 and second acoustic decoupler 230 controls the coupling of the acoustic signal from acoustically-resonant electrical insulator 216 to FBAR 120. Acoustic decouplers 130 and 230 collectively define the bandwidth of acoustic coupler 200. Specifically, due to the substantial mis-match in acoustic impedance between first acoustic decoupler 130 on one hand and FBAR 110 and acoustically-resonant electrical insulator 216 on the other hand, acoustic decoupler 130 couples less of the acoustic signal from FBAR 110 to acoustically-resonant electrical insulator 216 than would be coupled by direct contact between the FBAR 110 and acoustically-resonant electrical insulator 216. Similarly, due to the substantial mis-match in acoustic impedance between second acoustic decoupler 230 on one hand and acoustically-resonant electrical insulator 216 and FBAR 120 on the other hand, acoustic decoupler 230 couples less of the acoustic signal from acoustically-resonant electrical insulator 216 to FBAR 120 than would be coupled by direct contact between acoustically-resonant electrical insulator 216 and FBAR 120. The bandwidth of acoustic coupler 200 is somewhat narrower bandwidth than that of acoustic coupler 100 described above with reference to FIG. 2, in which each DSBAR has a single acoustic decoupler 130.

A common quarter-wave layer of electrically-insulating material may be used to provide both acoustically-resonant electrical insulator 216 and acoustically-resonant electrical insulator 256. In the example shown in FIGS. 7A-7C, a quarter-wave layer 217 of electrically-insulating material provides acoustically-resonant electrical insulators 216 and 256. Alternatively, acoustically-resonant electrical insulators 216 and 256 may be independently provided.

Figure 9A:
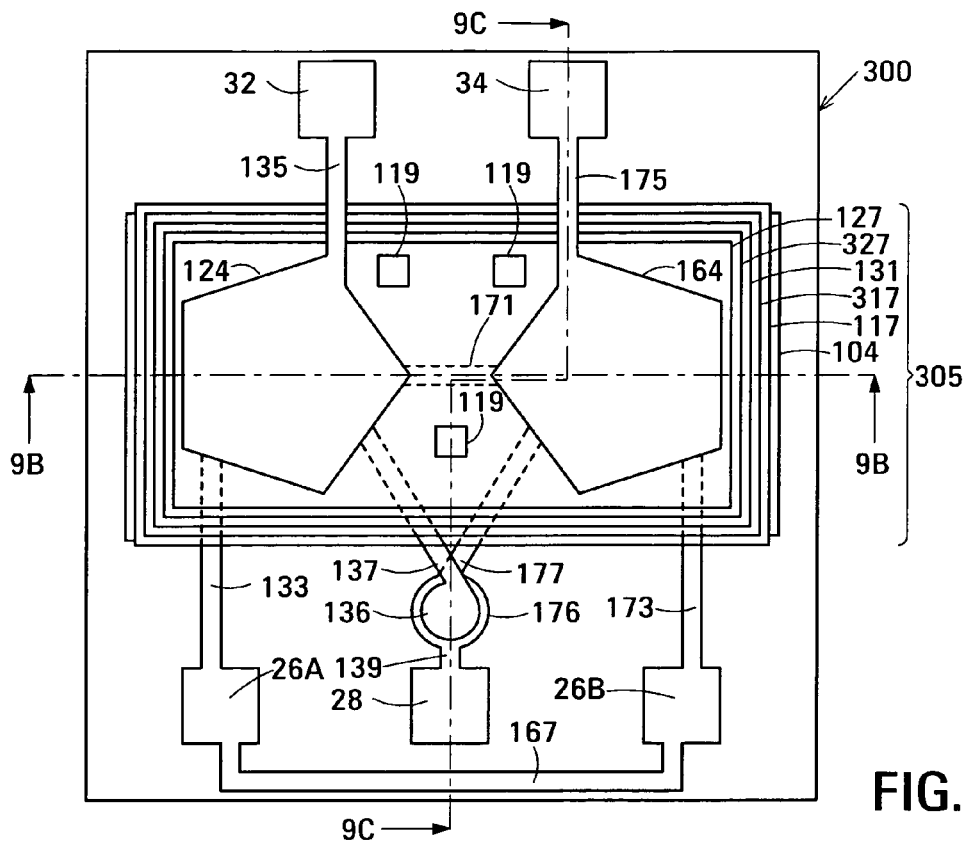
FIG. 9A is a plan view showing a practical example of the acoustic coupler shown in FIG. 8.
Figure 9B:
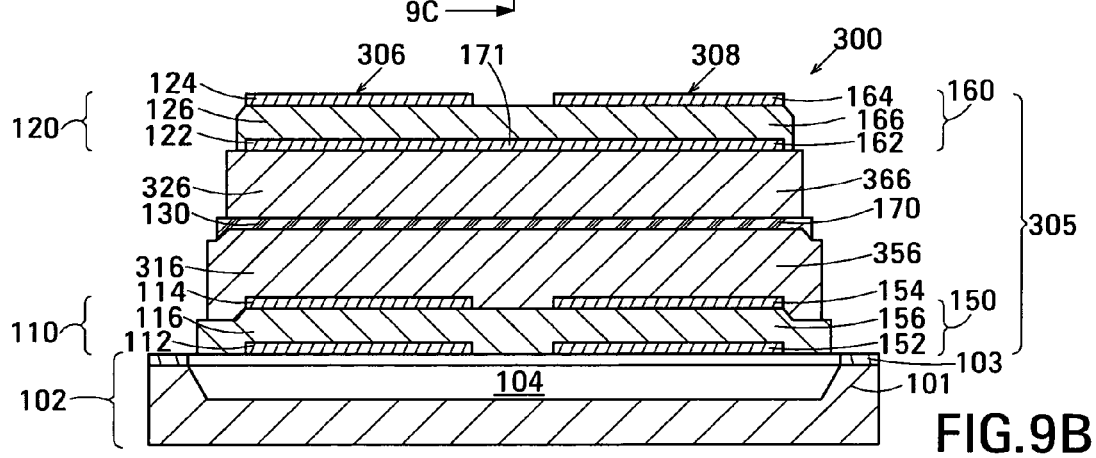
FIGS. 9B and 9C are cross-sectional views along section lines 9B-9B and 9C-9C, respectively, shown in FIG. 9A.
Figure 9C:
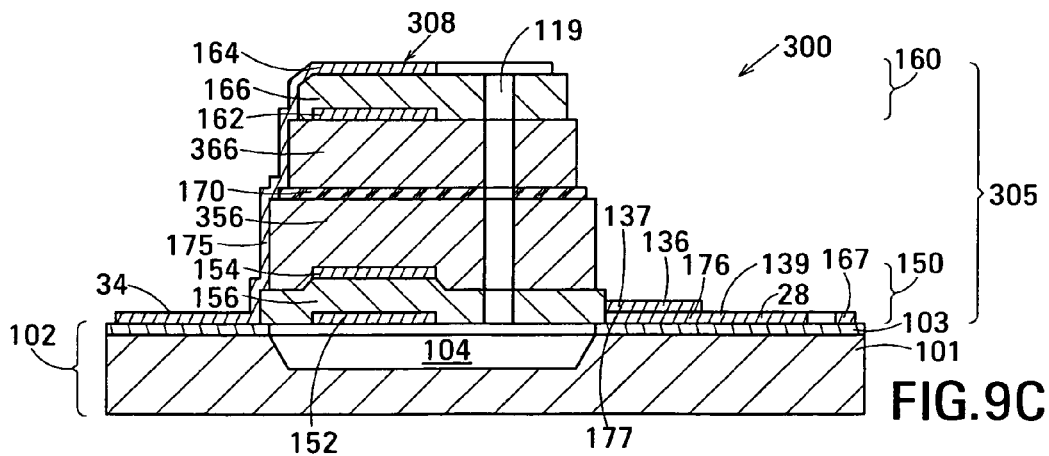

FIG. 8 is a schematic diagram showing an example of an acoustic coupler 300 in accordance with a third embodiment of the invention. FIG. 9A is a plan view showing a practical example of acoustic coupler 300. FIGS. 9B and 9C are cross-sectional views along section lines 9B-9B and 9C-9C, respectively, in FIG. 9A. The same reference numerals are used to denote the elements of acoustic coupler 300 in FIG. 8 and in FIGS. 9A-9C.

Acoustic coupler 300 comprises inputs 26, 28, outputs 32, 34, and an electrically-isolating film acoustically-coupled transformer (FACT) 305. FACT 305 is composed of a first insulated decoupled stacked bulk acoustic resonator (IDSBAR) 306 and a second IDSBAR 308, an electrical circuit 140 that interconnects IDSBAR 306 and IDSBAR 308 and that additionally connects IDSBARs 306 and 308 to inputs 26, 28, and an electrical circuit 141 that interconnects IDSBAR 306 and IDSBAR 308 and that additionally connects IDSBARs 306 and 308 to outputs 32, 34. In electrically-isolating FACT 305, each of IDSBAR 306 and IDSBAR 308 is an IDSBAR in accordance with a second IDSBAR embodiment. In its simplest form, an IDSBAR in accordance with the second IDSBAR embodiment has a first half-wave acoustically-resonant electrical insulator, an acoustic decoupler and a second half-wave acoustically-resonant electrical insulator located in order between its constituent FBARs. The half-wave acoustically-resonant electrical insulators provide additional electrical insulation without impairing the transmission integrity of modulated electrical signal $S_M$ from inputs 26, 28 to outputs 32, 34. IDSBAR 306 in accordance with the second IDSBAR embodiment gives acoustic coupler 300 a substantially greater breakdown voltage than otherwise similar embodiments of acoustic coupler 200 described above with reference to FIG. 6 and acoustic coupler 100 described above with reference to FIG. 2.

When used as electrically-isolating acoustic coupler 16 in acoustic galvanic isolator 10 shown in FIG. 1, acoustic coupler 300 acoustically couples modulated electrical signal $S_M$ from inputs 26, 28 to outputs 32, 34 while providing electrical isolation between inputs 26, 28 and outputs 32, 34. Thus, acoustic coupler 300 effectively galvanically isolates output terminals 36, 38 from input terminals 22, 24, and allows the output terminals to differ in voltage from the input terminals by a voltage up to its specified breakdown voltage.

In acoustic decoupler 300, FACT 305 comprises an insulated decoupled stacked bulk acoustic resonator (IDSBAR) 306 and an IDSBAR 308, each in accordance with a second IDSBAR embodiment. Each of IDSBAR 306 and IDSBAR 308 has a first half-wave acoustically-resonant electrical insulator, an acoustic decoupler and a second half-wave acoustically-resonant electrical insulator located in order between its FBARs. The half-wave acoustically-resonant electrical insulators are two in number and are twice as thick as quarter-wave acoustically-resonant electrical insulators 216 and 256 described above with reference to FIGS. 6 and 7A-7C and therefore collectively provide approximately four times the electrical isolation provided by acoustically-resonant electrical insulator 216 or acoustically-resonant electrical insulator 256. As a result, embodiments of acoustic coupler 300 have a greater breakdown voltage between inputs 26, 28 and outputs 32, 34 than otherwise similar embodiments of acoustic coupler 100 described above with reference to FIG. 2 and acoustic coupler 200 described above with reference to FIG. 6.

In the example of acoustic coupler 300 shown in FIGS. 8 and 9A-9C, IDSBAR 306 comprises lower film bulk acoustic resonator (FBAR) 110, upper FBAR 120 stacked on FBAR 110 and, located in order between lower FBAR 110 and upper FBAR 120, a first half-wave acoustically-resonant electrical insulator 316, acoustic decoupler 130 and a second half-wave acoustically-resonant electrical insulator 326. IDSBAR 308 comprises lower FBAR 150, upper FBAR 160 stacked on FBAR 150 and, located in order between lower FBAR 150 and upper FBAR 160, a first half-wave acoustically-resonant electrical insulator 356, acoustic decoupler 170 and a second half-wave acoustically-resonant electrical insulator 366. Other embodiments of IDSBAR 306 and IDSBAR 308 each comprise an even number (2n) of half-wave acoustically-resonant electrical insulators interleaved with a corresponding number (2n−1) of acoustic decouplers located between the respective FBARs.

FBARs 110, 120, 150 and 160, acoustic decouplers 130 and 170, electrical circuits 140 and 141 and substrate 102 are described above with reference to FIGS. 2 and 4A-4C and will not be described again here. The exemplary embodiments of acoustic decoupler 130 described above with reference to FIGS. 5A and 5B may be used to provide each acoustic decoupler 130 and 170. One or more common quarter-wave layers of material may be used to provide both acoustic decoupler 130 and acoustic decoupler 170. In the example shown in FIGS. 9A-9C, an acoustic decoupling layer 131 of acoustic decoupling material provides acoustic decouplers 130 and 170. Alternatively, acoustic decouplers 130 and 170 may each be independently provided.

Half-wave acoustically-resonant electrical insulator 316 will now be described. The following description also applies to half-wave acoustically-resonant electrical insulators 326, 356, and 366. Therefore, acoustically-resonant electrical insulators 326, 356, and 366 will not be individually described. Acoustically-resonant electrical insulator 316 is a half-wave layer of electrically-insulating material that is nominally matched in acoustic impedance to FBARs 110 and 120. Embodiments in which half-wave acoustically-resonant electrical insulator 316 is a one half-wave layer typically couple modulated electrical signal $S_M$ from inputs 26, 28 to outputs 32, 34 with optimum signal integrity.

At the center frequency of acoustic coupler 300, half-wave acoustically-resonant electrical insulator 316 and half-wave acoustically-resonant electrical insulator 326 are acoustically transparent. Half-wave acoustically-resonant electrical insulator 316 couples the acoustic signal generated by FBAR 110 to acoustic decoupler 130 and half-wave acoustically-resonant electrical insulator 326 couples the acoustic signal transmitted by acoustic decoupler 130 to FBAR 120. Thus, IDSBAR 306 has transmission characteristics similar to those of DSBAR 106 described above with reference to FIGS. 2 and 4A-4C. Additionally, half-wave acoustically-resonant electrical insulators 316 and 326 electrically insulate FBAR 120 from FBAR 110. Piezoelectric element 126 and, typically, acoustic decoupler 130 provide additional electrical insulation as described above. IDSBAR 308 has similar properties. Thus, acoustic coupler 300 effectively couples the modulated electrical signal $S_M$ from inputs 26, 28 to outputs 32, 34 but electrically isolates outputs 32, 34 from inputs 26, 28.

The materials described above with reference to FIGS. 6 and 7A-7C as being suitable for use as quarter-wave acoustically-resonant electrical insulator 216 are suitable for use as half-wave acoustically-resonant electrical insulators 316, 326, 356 and 366. The materials of half-wave acoustically-resonant electrical insulators 316, 326, 356 and 366 will therefore not be further described.

Half-wave acoustically-resonant electrical insulator 316 is twice as thick as piezoelectric element 126, and two half-wave acoustically-resonant electrical insulators 316 and 326 separate FBAR 120 from FBAR 110. As a result, a given voltage between inputs 26, 28 and outputs 32, 34 produces a much lower electric field when applied across half-wave acoustically-resonant electrical insulators 316 and 326, acoustic decoupler 130 and piezoelectric element 126 than when applied across acoustic decoupler 130 and piezoelectric element 126 in the embodiment of acoustic coupler 100 described above with reference to FIG. 2. Consequently, acoustic coupler 300 typically has a substantially greater breakdown voltage than acoustic coupler 100.

A common half-wave layer of electrically-insulating material may be used to provide both half-wave acoustically-resonant electrical insulator 316 and half-wave acoustically-resonant electrical insulator 356, and a common half-wave layer of electrically-insulating material may be used to provide both half-wave acoustically-resonant electrical insulator 326 and half-wave acoustically-resonant electrical insulator 366. In the example shown in FIGS. 9A-9C, a half-wave layer 317 of electrically-insulating material provides half-wave acoustically-resonant electrical insulators 316 and 356, and a half-wave layer 327 of electrically-insulating material provides half-wave acoustically-resonant electrical insulators 326 and 366. Alternatively, acoustically-resonant electrical insulators 316, 326, 356 and 366 may be independently provided.

Figure 10:
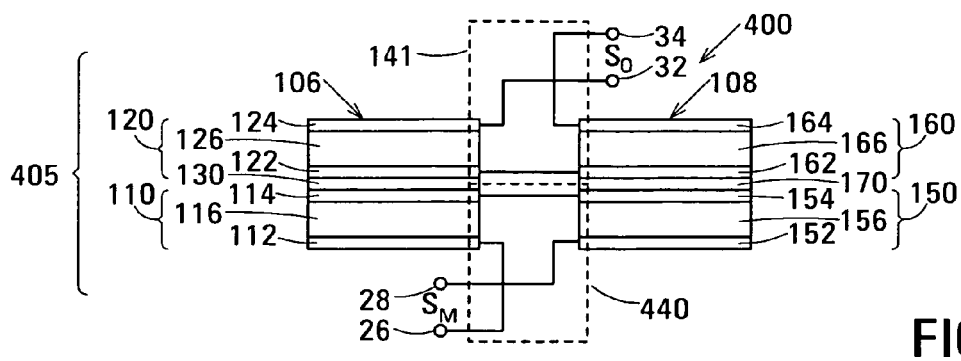
FIG. 10 is a schematic diagram showing an example of an acoustic coupler in accordance with a fourth embodiment of the invention that may be used as the electrically-isolating acoustic coupler of the acoustic galvanic isolator shown in FIG. 1.
Figure 11A:
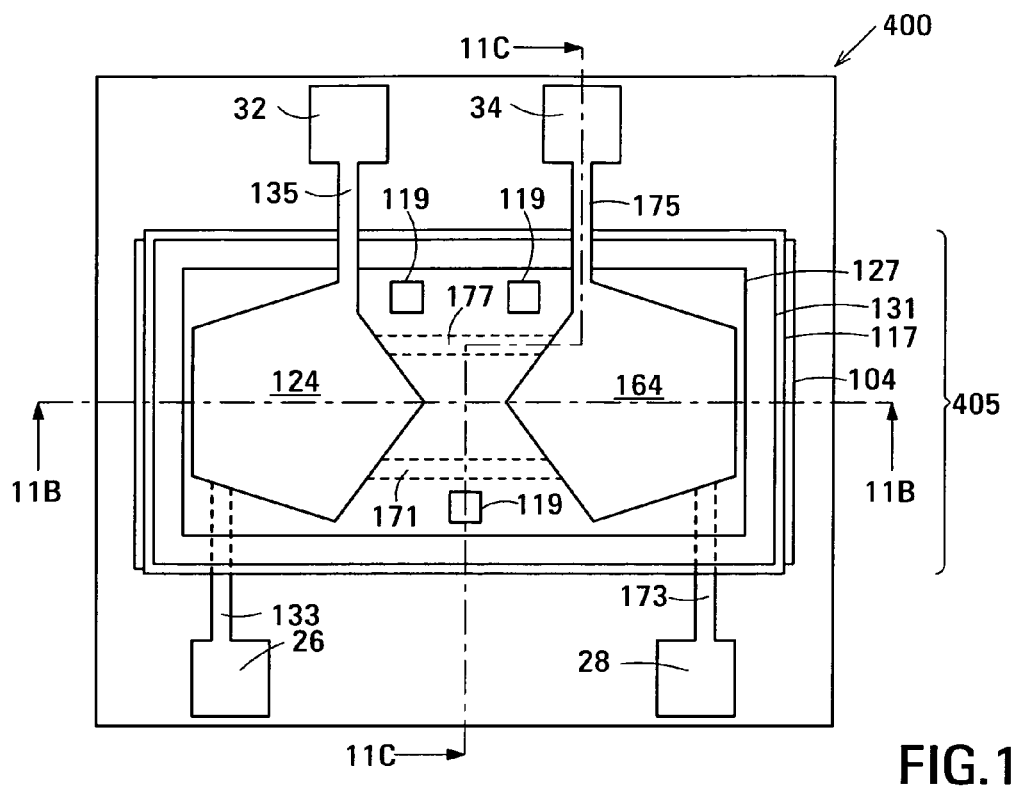
FIG. 11A is a plan view showing a practical example of the acoustic coupler shown in FIG. 10.
Figure 11B:
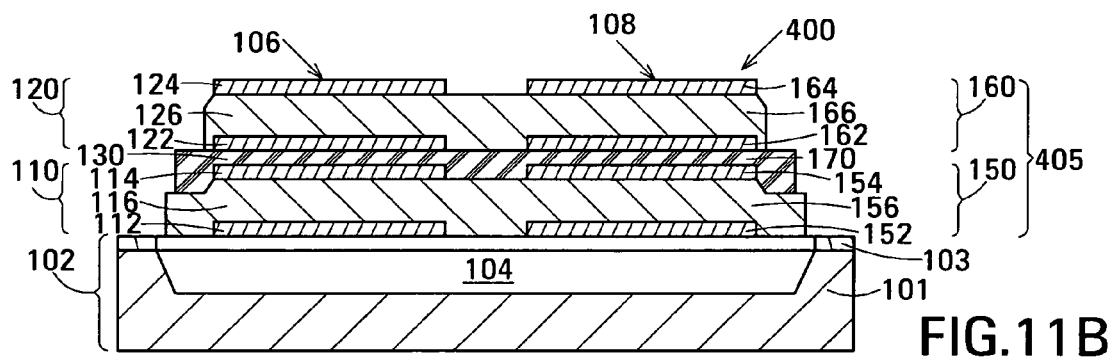
FIGS. 11B and 11C are cross-sectional views along section lines 11B-11B and 11C-11C, respectively, shown in FIG. 11.
Figure 11C:
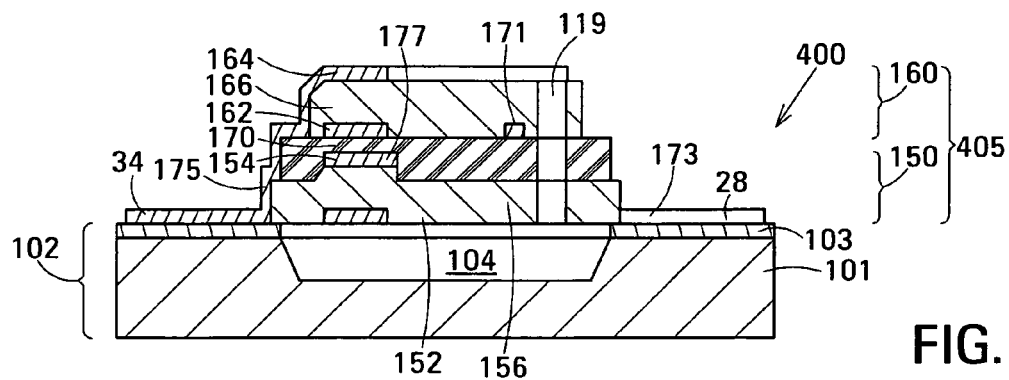

FIG. 10 is a schematic diagram showing an example of an acoustic coupler 400 in accordance with a fourth embodiment of the invention. FIG. 11A is a plan view showing a practical example of acoustic coupler 400. FIGS. 11B and 11C are cross-sectional views along section lines 11B-11B and 11C-11C, respectively, in FIG. 11A. The same reference numerals are used to denote the elements of acoustic coupler 400 in FIG. 10 and in FIGS. 11A-11C. Acoustic coupler 400 provides a higher breakdown voltage than acoustic coupler 100 described above with reference to FIGS. 2 and 4A-4C without additional insulating layers.

Acoustic coupler 400 comprises inputs 26, 28, outputs 32, 34, and an electrically-isolating film acoustically-coupled transformer (FACT) 405. In acoustic coupler 400, FACT 405 comprises a first decoupled stacked bulk acoustic resonator (DSBAR) 106 and a second DSBAR 108, an electrical circuit 440 that interconnects DSBAR 106 and DSBAR 108 and that additionally connects DSBARs 106 and 108 to inputs 26, 28, and an electrical circuit 141 that interconnects DSBAR 106 and DSBAR 108 and that additionally connects DSBARs 106 and 108 to outputs 32, 34. In electrically-isolating FACT 405, electrical circuit 440 connects DSBARs 106 and 108 in series. This locates the piezoelectric elements of both film bulk acoustic resonators (FBARs) of each of DSBAR 106 and DSBAR 108 in series between inputs 26, 28 and outputs 32, 34, where the piezoelectric elements provide electrical isolation. Consequently, for a given piezoelectric material and piezoelectric element thickness and for a given acoustic decoupler structure and materials, acoustic coupler 400 has a breakdown voltage similar to that of acoustic coupler 200 described above with reference to FIG. 6 but is simpler to fabricate, since it has fewer constituent layers. Acoustic coupler 400 has the same number of constituent layers as acoustic coupler 100 described above with reference to FIG. 2, but acoustic coupler 100 has a lower breakdown voltage.

When used as electrically-isolating acoustic coupler 16 in acoustic galvanic isolator 10 shown in FIG. 1, acoustic coupler 400 acoustically couples modulated electrical signal $S_M$ from inputs 26, 28 to outputs 32, 34 while providing electrical isolation between inputs 26, 28 and outputs 32, 34. Thus, acoustic coupler 400 effectively galvanically isolates output terminals 36, 38 from input terminals 22, 24, and allows the output terminals to differ in voltage from the input terminals by a voltage up to its specified breakdown voltage.

DSBARs 106 and 108 and substrate 102 are described above with reference to FIGS. 2 and 4A-4C. Electrical circuit 440 connects FBAR 110 of DSBAR 106 in series with FBAR 150 of DSBAR 108 between inputs 26, 28, and electrical circuit 141 connects FBAR 120 of DSBAR 106 in series with FBAR 160 of DSBAR 108 in series between outputs 32, 34. Specifically, in electrical circuit 440, input 26 is connected to electrode 112 of FBAR 110, electrode 114 of FBAR 110 is connected to electrode 154 of FBAR 150 and electrode 152 of FBAR 150 is connected to input 28. Moreover, in electrical circuit 141, output 32 is connected to electrode 124 of FBAR 120, electrode 122 of FBAR 120 is connected to electrode 162 of FBAR 160 and electrode 164 of FBAR 160 is connected to output 34. The arrangement of electrical circuits 440 and 141 just described connects inputs 26, 28 to electrodes 112 and 152, respectively, and outputs 32, 34 to electrodes 124 and 164, respectively. Electrodes 124 and 164 connected to outputs 32, 34 are physically separated from electrodes 112 and 152 connected to inputs 26, 28 by piezoelectric elements 116 and 156, acoustic decouplers 130 and 170 and piezoelectric elements 126 and 166. At least piezoelectric elements 116 and 156 and piezoelectric elements 126 and 166 are electrically insulating. Typically, acoustic decouplers 130 and 170 are also electrically insulating. Consequently, for similar materials and layer thicknesses, acoustic coupler 400 has a breakdown voltage similar to that of acoustic decoupler 200 described above with reference to FIGS. 6 and 7A-7C, but is simpler to fabricate because it has fewer layers.

In the practical example of acoustic coupler 400 shown in FIGS. 11A-11C, inputs 26, 28 shown in FIG. 10 are embodied as terminal pads 26 and 28 located on the major surface of substrate 102. Electrical circuit 440 shown in FIG. 10 is composed of an electrical trace 133 that extends from terminal pad 26 to electrode 112 of FBAR 110, an electrical trace 177 that extends from electrode 114 of FBAR 110 to electrode 154 of FBAR 150 and an electrical trace 173 that extends from electrode 152 of FBAR 150 to terminal pad 28. Electrical traces 133 and 173 extend over part of the major surface of substrate 102 and under part of piezoelectric layer 117. Electrical trace 177 extends over part of the major surface of piezoelectric layer 117.

Outputs 32, 34 are embodied as terminal pads 32 and 34 located on the major surface of substrate 102. The embodiment of electrical circuit 141 in the example shown in FIGS. 11A-11C is described above with reference to FIGS. 4A-4C.

In some embodiments of acoustic galvanic isolator 10, modulator 14 is fabricated in and on the same substrate 102 as electrically-isolating acoustic coupler 16. In such embodiments, terminal pads 26 and 28 are typically omitted and electrical traces 133 and 173 are extended to connect to corresponding traces constituting part of modulator 14. Additionally or alternatively, demodulator 18 is fabricated in and on the same substrate 102 as electrically-isolating acoustic coupler 16. In such embodiments, terminal pads 32 and 34 are typically omitted and electrical traces 135 and 175 are extended to connect to corresponding traces constituting part of demodulator 18.

In embodiments of acoustic galvanic isolator 10 (FIG. 1) in which any one of the acoustic coupler embodiments described above with reference to FIGS. 2, 6 and 8 is used as electrically-isolating acoustic coupler 16, modulator 14 drives the inputs 26, 28 of the acoustic coupler with a single-ended modulated electrical signal $S_M$. However, modulated electrical signal $S_M$ is coupled from inputs 26, 28 to outputs 32, 34 with optimum signal integrity in embodiments of acoustic galvanic isolator 10 in which acoustic coupler 400 is used as electrically-isolating acoustic coupler 16 and in which modulator 14 has a differential output circuit that drives the inputs 26, 28 of acoustic coupler 400 differentially. Differential output circuits are known in the art and will therefore not be described here.

Acoustic coupler 400 may additionally be used as electrically-isolating acoustic coupler 16 in embodiments of acoustic galvanic isolator 10 shown in FIG. 1 in which modulator 14 has a single-ended output by interposing an additional film acoustically-coupled transformer (FACT) similar to FACT 105 described above with reference to FIG. 2 between inputs 26, 28 and FACT 405. The additional FACT converts the single-ended output of modulator 14 into a differential signal suitable for driving FACT 405.

Figure 12A:
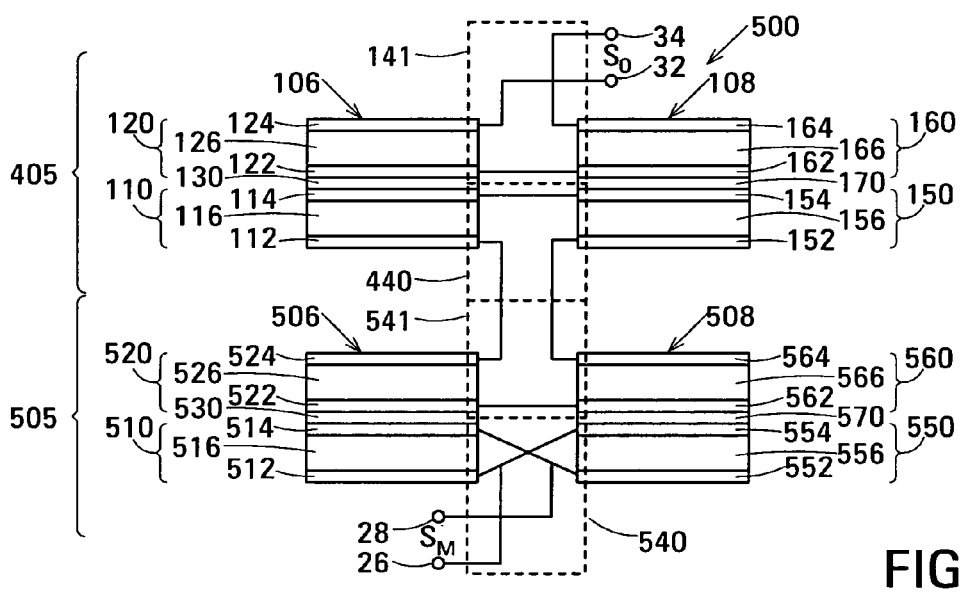
FIG. 12A is a schematic diagram showing an example of an acoustic coupler in accordance with a fifth embodiment of the invention that may be used as the electrically-isolating acoustic coupler of the acoustic galvanic isolator shown in FIG. 1.

FIG. 12A is a schematic diagram showing an example of an acoustic coupler 500 in accordance with a fifth embodiment of the invention in which an additional FACT 505 is interposed between inputs 26, 28 and FACT 405. Acoustic coupler 500 may be used as electrically-isolating acoustic coupler 16 in acoustic galvanic isolator 10 shown in FIG. 1.

The description of FACT 105 set for the above with reference to FIGS. 2 and 4A-4C applies to FACT 505 with the exception that the reference numerals used to indicate the elements of the latter have five instead of one as their first digit. For example FBAR 510 of FACT 505 corresponds to FBAR 110 of FACT 105 described above with reference to FIG. 2. In the embodiment of FACT 505 shown in FIG. 12A, electrical circuit 540 connects FBARs 510 and 550 in anti-parallel and to inputs 26, 28 and electrical circuit 541 connects FBARs 520 and 560 in series, all as described above with reference to FIG. 2. Anti parallel-connected FBARs 510 and 550 can be driven by an embodiment of modulator 14 having a single-ended output. Series-connected FBARs 520 and 560 generate a differential output signal suitable for driving the series-connected FBARs 110 and 150 of FACT 405. Electrical circuit 541 of FACT 505 is connected to electrical circuit 440 of FACT 405 to connect series-connected FBARs 520 and 560 of FACT 505 to series-connected FBARs 110 and 160, respectively, of FACT 405.

FACT 505 and FACT 405 may be fabricated independently of one another on separate substrates. Such independent fabrications of FACT 505 and FACT 405 would appear similar to FACT 105 shown in FIGS. 4A-4C and FACT 405 shown in FIGS. 11A-11C, respectively. With independent fabrication, electrical circuit 541 of FACT 505 is connected to electrical circuit 440 of FACT 405 by establishing electrical connections (not shown) between terminal pads 32, 34 (FIG. 4A) of FACT 505 and terminal pads 26, 28 (FIG. 11A) of FACT 405. Terminal pads 26A, 26B and 28 (FIG. 4A) of FACT 505 provide the inputs 26, 28 of acoustic coupler 500 and terminal pads 32, 34 (FIG. 11A) of FACT 405 provide the outputs 32, 34 of acoustic coupler 500. Wire bonding, flip-chip connections or another suitable connection process may be used to establish the electrical connections between electrical circuit 541 of FACT 505 and electrical circuit 440 of FACT 405.

Figure 12B:
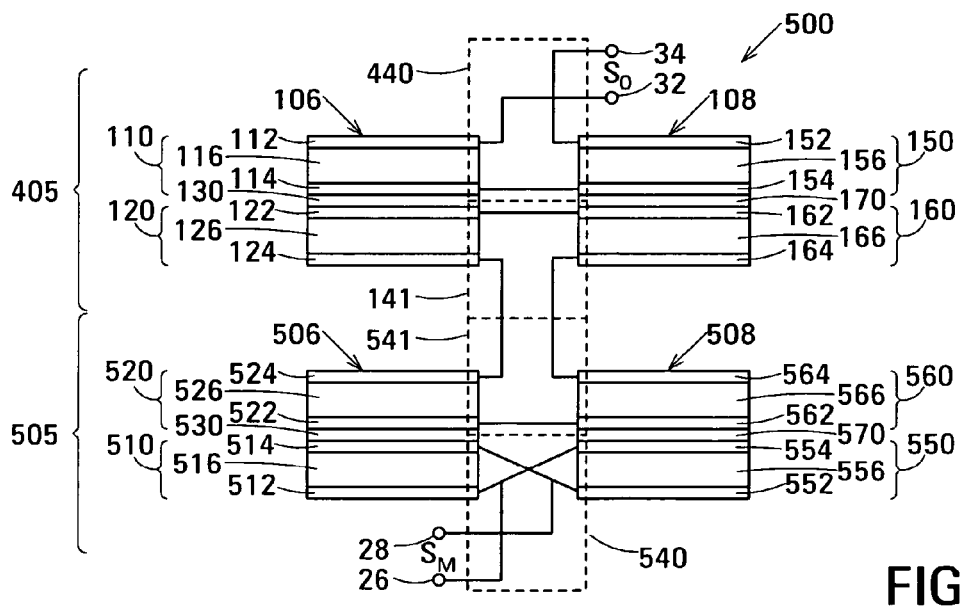
FIG. 12B is a schematic diagram showing an example of an acoustic coupler in accordance with the fifth embodiment of the invention in which the constituent FACTs are fabricated on a common substrate.
Figure 13:
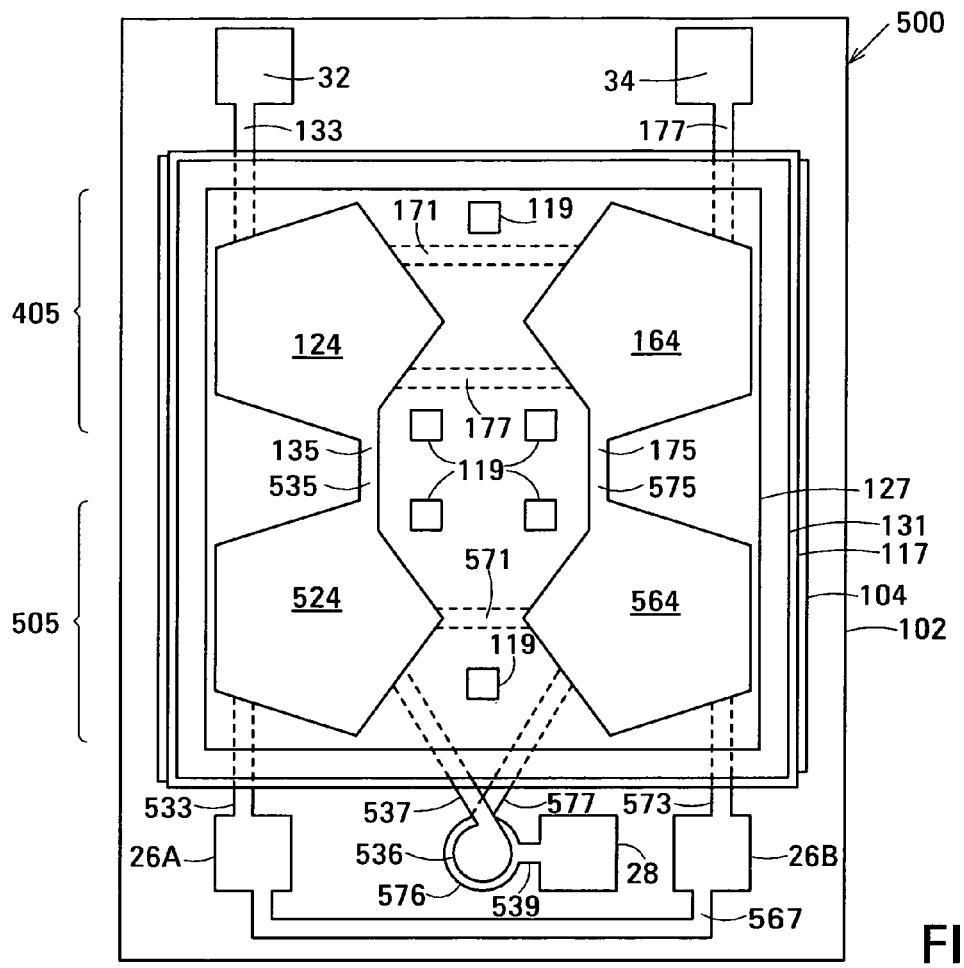
FIG. 13 is a plan view showing a practical example of the acoustic coupler shown in FIG. 12B.

FACT 505 and FACT 405 may alternatively be fabricated on a common substrate. In such an embodiment, electrical circuit 541 of FACT 505 may be electrically connected to electrical circuit 440 of FACT 405 as just described. However, the structure of such a common-substrate embodiment can be simplified by reversing the electrical connections to FACT 405, so that electrical circuit 141 of FACT 405 is connected to electrical circuit 541 of FACT 505 and electrical circuit 440 of FACT 405 is connected to outputs 32, 34. FIG. 12B is a schematic diagram showing an example of an embodiment of acoustic coupler 500 in accordance with the fifth embodiment of the invention in which FACTs 405 and 505 are fabricated on a common substrate. FIG. 13 is a plan view showing a practical example of such an embodiment of acoustic coupler 500. Cross sectional views of FACT 405 are shown in FIGS. 11A and 11B and cross-sectional views of FACT 505 are shown in FIGS. 4B and 4C.

In the example shown in FIGS. 12B and 13, FACT 405 and FACT 505 are fabricated suspended over a common cavity 104 defined in a common substrate 102 and have common metal layers in which their electrodes and electrical traces are defined, common piezoelectric layers 117, 127 that provide their piezoelectric elements and a common acoustic decoupling layer 131 that provides their acoustic decouplers. Alternatively, FACT 405 and FACT 505 may be fabricated suspended over respective cavities (not shown) defined in a common substrate and have common metal layers, piezoelectric layers and acoustic decoupling layer. As a further alternative, FACT 405 and FACT 505 may be fabricated suspended over respective cavities (not shown) defined in a common substrate and have respective metal layers, piezoelectric layers and acoustic decoupling layers.

As noted above, the electrical connections to FACT 405 are reversed to simplify the electrical connections between FACT 505 and FACT 405. This reverses the direction of acoustic signal flow in FACT 405 compared with the example described above with reference to FIGS. 10 and 11A-11C. Consequently, the direction of acoustic signal flow in FACT 405 is opposite that in FACT 505. In the example shown in FIGS. 12B and 13, series-connected FBARs 120 and 160 in FACT 405 receive a differential electrical signal from FBARs 520 and 560, respectively, of FACT 505 and, in response thereto, generate acoustic signals that are coupled by acoustic decouplers 130 and 170, respectively, to series-connected FBARs 110 and 150, respectively. In response to the acoustic signals, FBARs 110 and 150 generate differential electrical output signal $S_O$. With the reverse signal flow in FACT 505, electrical circuit 141 of FACT 405 is electrically connected to electrical circuit 541 of FACT 505 by an electrical connection between electrical trace 135 and electrical trace 535 and an electrical connection between electrical trace 175 and electrical trace 575. Electrical traces 535 and 135 extend over the major surface of piezoelectric layer 127 from electrode 524 of FACT 505 to electrode 124 of FACT 405 and electrical traces 575 and 175 extend over the major surface of piezoelectric layer 127 from electrode 564 of FACT 505 to electrode 164 of FACT 405. Terminal pads 26A, 26B and terminal pad 28 connected to electrodes 512 and 552, respectively, of FACT 505 provide the inputs 26, 28 of acoustic coupler 500 and terminal pads 32, 34 connected to electrodes 112 and 152, respectively, of FACT 405 provide the outputs 32, 34 of acoustic coupler 500.

Alternatively, FACT 405 and FACT 505 may be fabricated on a common substrate without reversing the direction of the acoustic signal in FACT 405. In this case, electrical traces 535 and 575 connect electrodes 524 and 564, respectively, of FACT 505 to electrodes 112 and 152, respectively, of FACT 405 and terminal pads 32, 34 connected to electrodes 124 and 164, respectively, of FACT 405 provide the outputs 32, 34 of acoustic coupler 500.

Thousands of acoustic galvanic isolators similar to acoustic galvanic isolator 10 are fabricated at a time by wafer-scale fabrication. Such wafer-scale fabrication makes the acoustic galvanic isolators inexpensive to fabricate. The wafer is selectively etched to define a cavity in the location of the electrically-isolating acoustic coupler 16 of each acoustic galvanic isolator to be fabricated on the wafer. The cavities are filled with sacrificial material and the surface of the wafer is planarized. The local oscillator 12, modulator 14 and demodulator 18 of each acoustic galvanic isolator to be fabricated on the wafer are fabricated in and on the surface of the wafer using conventional semiconductor fabrication processing. The fabricated circuit elements are then covered with a protective layer. Exemplary materials for the protective layer are aluminum nitride and silicon nitride.

Embodiments of acoustic coupler 100 described above with reference to FIGS. 4A-4C, acoustic coupler 400 described above with reference to FIGS. 11A-11C or acoustic coupler 500 described above with reference to FIG. 13 are then fabricated by sequentially depositing and patterning the following layers: a first layer of electrode material, a first layer of piezoelectric material, a second layer of electrode material, a layer of acoustic decoupling material or the layers of an acoustic Bragg structure, a third layer of electrode material, a second layer of piezoelectric material and a fourth layer of electrode material. These layers form the FACT and the electrical circuits of each acoustic coupler. The electrical circuits additionally connect the FACT to exposed connection points on modulator 14 and demodulator 18.

Embodiments of acoustic coupler 200 described above with reference to FIGS. 7A-7C are fabricated as just described, except that a quarter-wave layer of electrically-insulating material and one or more layers constituting an additional acoustic decoupler are deposited and patterned after the one or more layers constituting the acoustic decoupler have been deposited and patterned. Embodiments of acoustic coupler 300 described above with reference to FIGS. 9A-9C are fabricated as just described, except that a first half-wave layer of electrically-insulating material is deposited and patterned before, and a second half-wave layer of electrically-insulating material is deposited and patterned after, the one or more layers constituting the acoustic decoupler have been deposited and patterned.

After the acoustic couplers have been fabricated, the sacrificial material is removed to leave each constituent FACT suspended over its respective cavity. Access holes shown at 119 provide access to the sacrificial material to facilitate removal. The protective material is then removed from the fabricated circuit elements. The substrate is then divided into individual acoustic galvanic isolators each similar to acoustic galvanic isolator 10. An exemplary process that can be used to fabricate a FACT is described in more detail in United States patent application publication no. 2005 0 093 655, assigned to the assignee of this disclosure and incorporated by reference, and can be adapted to fabricate the FACTs of the acoustic galvanic isolators described above.

Alternatively, acoustic couplers 100, 200, 300, 400 or 500 are fabricated on a different wafer from that on which local oscillators 12, modulators 14 and demodulators 18 are fabricated. In this case, the acoustic galvanic isolators may be made by using a wafer bonding process to join the respective wafers to form a structure similar to that described by John D. Larson III et al. with reference to FIGS. 8A-8E of United States patent application publication no. 2005 0 093 659, assigned to the assignee of this disclosure and incorporated by reference.

In a further alternative, local oscillators 12, modulators 14 and acoustic couplers 100, 200, 300, 400 or 500 are fabricated on one wafer and corresponding demodulators 18 are fabricated on the other wafer. The wafers are then bonded together as just described to form the acoustic galvanic isolators. Alternatively, the local oscillators 12 and modulators 14 are fabricated on one wafer and the acoustic couplers 100, 200, 300, 400 or 500 and demodulators 18 are fabricated on the other wafer. The wafers are then bonded together as just described to form the acoustic galvanic isolators.

In another alternative suitable for use in applications in which the acoustic galvanic isolators are specified to have a large breakdown voltage between input terminals 22, 24 and output terminals 36, 38, multiple input circuits each comprising an instance of local oscillator 12 and an instance of modulator 14 and multiple output circuits each comprising an instance of demodulator 18 are fabricated in and on a semiconductor wafer. The wafer is then singulated into individual semiconductor chips each embodying a single input circuit or a single output circuit. The electrically-isolating acoustic coupler 16 of each acoustic galvanic isolator is fabricated suspended over a cavity defined in a ceramic wafer having conductive traces located on its major surface. For each acoustic galvanic isolator fabricated on the wafer, one semiconductor chip embodying an input circuit and one semiconductor chip embodying an output circuit are mounted on the ceramic wafer in electrical contact with the conductive traces. For example, the semiconductor chips may be mounted on the ceramic wafer by ball bonding or flip-chip bonding. Ceramic wafers with attached semiconductor chips can also be used in the above-described two wafer structure.

In an exemplary embodiment of acoustic galvanic isolator 10 operating at a carrier frequency of about 1.9 GHz; the material of electrodes 112, 114, 122, 124, 152, 154, 162 and 164 is molybdenum. Each of the electrodes has a thickness of about 300 nm and is pentagonal in shape with an area of about 12,000 square μm. A different area gives a different characteristic impedance. The non-parallel sides of the electrodes minimize lateral modes in FBARs 110, 120, 150 and 160 as described by Larson III et al. in U.S. Pat. No. 6,215,375, assigned to the assignee of this disclosure and incorporated by reference. The metal layers in which electrodes 112, 114, 122, 124, 152, 154, 162 and 164 are defined are patterned such that, in respective planes parallel to the major surface of the wafer, electrodes 112 and 114 of FBAR 110 have the same shape, size, orientation and position, electrodes 122 and 124 of FBAR 120 have the same shape, size, orientation and position, electrodes 152 and 154 of FBAR 150 have the same shape, size, orientation and position, and electrodes 162 and 164 of FBAR 160 have the same shape, size, orientation and position. Typically, electrodes 114 and 122 additionally have the same shape, size, orientation and position and electrodes 154 and 162 additionally have the same shape, size, orientation and position. Alternative electrode materials include such metals as tungsten, niobium and titanium. The electrodes may have a multi-layer structure.

The material of piezoelectric elements 116, 126, 156 and 166 is aluminum nitride. Each piezoelectric element has a thickness of about 1.4 μm. Alternative piezoelectric materials include zinc oxide, cadmium sulfide and poled ferroelectric materials such as perovskite ferroelectric materials, including lead zirconium titanate (PZT), lead metaniobate and barium titanate.

The acoustic decoupling material of acoustic decoupling layer 131 constituting the embodiment of acoustic decoupler 130 shown in FIG. 5A is polyimide, parylene or a crosslinked polyphenylene polymer, as described above. A one quarter-wave layer of polyimide is about 100 nm thick whereas a one quarter-wave layer of crosslinked polyphenylene polymer is about 190 nm thick. As noted above, three-, five- or more quarter-wave layers may be used as the acoustic decoupling layer 131.

In embodiments of acoustic coupler 200 described above with reference to FIGS. 7A-7C, the material of acoustically-resonant electrical insulators 216 and 256 is aluminum nitride. Each acoustically-resonant electrical insulator has a thickness of about 1.4 μm. Alternative materials include aluminum oxide ($Al_2O_3$) and non-piezoelectric aluminum nitride. The acoustic decoupling material constituting acoustic decoupling layer 231 constituting the embodiments of acoustic decoupler 230 shown in FIG. 7A is polyimide, parylene or a crosslinked polyphenylene polymer, as described above.

In embodiments of acoustic coupler 300 described above with reference to FIGS. 9A-9C, the material of half-wave acoustically-resonant electrical insulators 316, 326, 356 and 366 is aluminum nitride. Each half-wave acoustically-resonant electrical insulator has a thickness of about 2.8 μm. Alternative materials include aluminum oxide ($Al_2O_3$) and non-piezoelectric aluminum nitride.

In the above-described example of acoustic galvanic isolator 10, inputs 26, 28 are connected to FBARs 110 and 120 and outputs 32, 34 are connected to FBARs 120 and 160. In other embodiments, the direction in which the acoustic signal flows is reversed, as described above, and outputs 32, 34 are connected to FBARs 110 and 150 and inputs 26, 28 are connected to FBARs 120 and 160.

Figure 14:
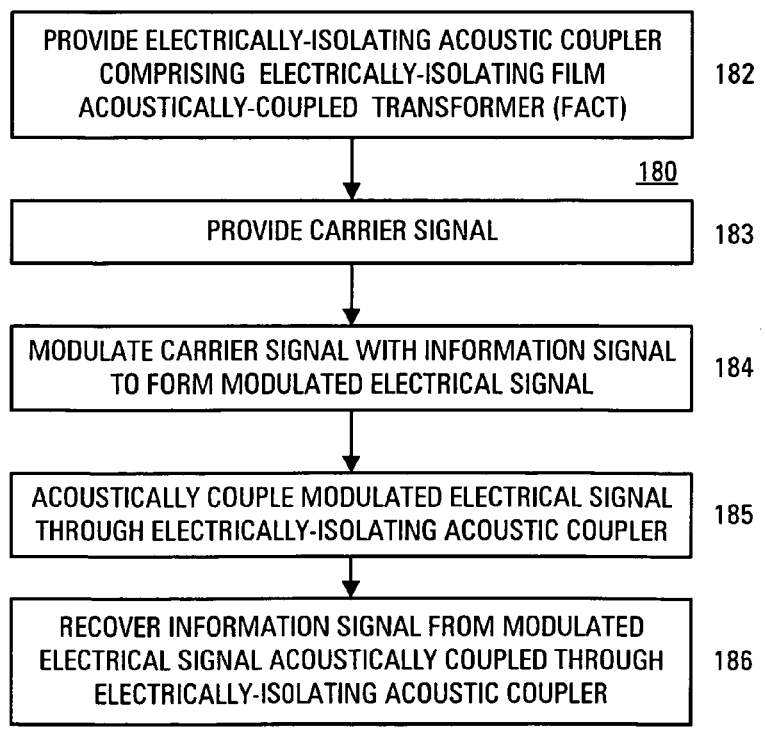
FIG. 14 is a flow chart showing an example of a method in accordance with an embodiment of the invention for galvanically isolating an information signal.

FIG. 14 is a flow chart showing an example of a method 180 in accordance with an embodiment of the invention for galvanically isolating an information signal. In block 182, an electrically-isolating acoustic coupler is provided. The electrically-isolating acoustic coupler comprises an electrically-isolating film acoustically-coupled transformer (FACT). In block 183, a carrier signal is provided. In block 184, the carrier signal is modulated with the information signal to form a modulated electrical signal. In block 185, the modulated electrical signal is acoustically coupled through the electrically-isolating acoustic coupler. In block 186, the information signal is recovered from the modulated electrical signal acoustically coupled though the acoustic coupler.

This disclosure describes the invention in detail using illustrative embodiments. However, the invention defined by the appended claims is not limited to the precise embodiments described.

We claim:

1. An acoustic galvanic isolator, comprising: a carrier signal source; a modulator connected to receive an information signal and the carrier signal; a demodulator; and connected between the modulator and the demodulator, an electrically-isolating acoustic coupler comprising an electrically-isolating film acoustically-coupled transformer (FACT), wherein the FACT comprises:
   a first decoupled stacked bulk acoustic resonator (DSBAR) and a second DSBAR, each of the DSBARs comprising:
      a first film bulk acoustic resonator (FBAR); a second FBAR; an acoustic decoupler between the first FBAR and the second FBAR, wherein each of the FBARs comprises an opposed pair of electrodes and a piezoelectric element between the electrodes; and
   a first electrical circuit interconnecting the first FBARs of the DSBARs in series; and
   a second electrical circuit interconnecting the second FBARs of the DSBARs in series, wherein the first electrical circuit additionally connects the first FBARs to the modulator, and the second electrical circuit additionally connects the second FBARs to the demodulator; and wherein: the first electrical circuit is connected to the electrodes of the first FBARs remote from the acoustic decouplers; and the second electrical circuit is connected to the electrodes of the second FBARs remote from the acoustic decouplers.

2. The acoustic galvanic isolator of claim 1, in which: the modulator has a differential output connected to the first electrical circuit; and the demodulator has a differential input connected to the second electrical circuit.

3. The acoustic galvanic isolator of claim 1, in which: the FACT is a first FACT; the modulator has a single-ended output; and the galvanic isolator additionally comprises a second FACT interposed between the modulator and the acoustic coupler, the second FACT comprising a first DSBAR and a second DSBAR, each DSBAR comprising a first FBAR and a second FBAR, the first FBARs connected in anti-parallel and to the output of the modulator, the second FBARs connected in series and to the first electrical circuit.

4. The acoustic galvanic isolator of claim 1, in which each of the DSBARs additionally comprises an acoustically-resonant electrical insulator.

5. The acoustic galvanic isolator of claim 4, in which the acoustically-resonant electrical insulator comprises a layer of electrically-insulating material differing in acoustic impedance from the FBARs by less than one order of magnitude.

6. The acoustic galvanic isolator of claim 4, in which the acoustically-resonant electrical insulator comprises a layer of electrically-insulating material matched in acoustic impedance with the FBARs.

7. The acoustic galvanic isolator of claim 4, in which: each of the DSBARs additionally comprises an additional acoustic decoupler between the FBARs; and the acoustically-resonant electrical insulator comprises a quarter-wave layer of electrically-insulating material located between the acoustic decoupler and the additional acoustic decoupler.

8. The acoustic galvanic isolator of claim 4, in which: the acoustically-resonant electrical insulator is a first half-wave acoustically-resonant electrical insulator; the each of the DSBARs additionally comprises a second half-wave acoustically-resonant electrical insulator; and the acoustic decoupler is located between the first half-wave acoustically-resonant electrical insulator and the second half-wave acoustically-resonant electrical insulator.

9. The acoustic galvanic isolator of claim 8, in which each half-wave acoustically-resonant electrical insulator comprises a half-wave layer of electrically-insulating material.

10. A method for galvanically isolating an information signal, the method comprising: providing an electrically-isolating acoustic coupler comprising an electrically-isolating film acoustically-coupled transformer (FACT), wherein the FACT comprises a first decoupled stacked bulk acoustic resonator (DSBAR) and a second DSBAR, each of the DSBARs comprising a first film bulk acoustic resonator (FBAR), a second FBAR and an acoustic decoupler between the FBARs; providing a carrier signal; modulating the carrier signal with the information signal to form a modulated electrical signal; acoustically coupling the modulated electrical signal through the electrically-insulating acoustic coupler; and recovering the information signal from the modulated electrical signal acoustically coupled through the electrically-isolating acoustic coupler, wherein each FBAR comprises first planar electrodes adjacent the acoustic decoupler, second electrodes remote from the acoustic decoupler, and a piezoelectric element between the electrodes; and the coupling comprises: applying the modulated electrical signal to the first electrodes of the first FBARs, and receiving the modulated electrical signal from the first electrodes of the second FBARs.

11. The method of claim 10, in which the coupling comprises: converting the modulated electrical signal to an acoustic signal; transmitting the acoustic signal through an electrical insulator; and converting the acoustic signal back to a modulated electrical signal.

12. The method of claim 10, in which each of the DSBARs additionally comprises an acoustically-resonant electrical insulator between the FBARs.

\* \* \* \* \*